(12) United States Patent
Anderson et al.

(10) Patent No.: US 10,937,615 B2
(45) Date of Patent: *Mar. 2, 2021

(54) TESTABLE SEALED RELAY AND SELF-DIAGNOSING RELAY

(71) Applicants: Edward W. Anderson, Morristown, NJ (US); William A. Anderson, Martinsville, NJ (US)

(72) Inventors: Edward W. Anderson, Morristown, NJ (US); William A. Anderson, Martinsville, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/853,005

(22) Filed: Apr. 20, 2020

(65) Prior Publication Data

US 2020/0266016 A1 Aug. 20, 2020

Related U.S. Application Data

(62) Division of application No. 16/010,903, filed on Jun. 18, 2018, now Pat. No. 10,685,800.

(51) Int. Cl.
*H01H 45/08* (2006.01)
*H01H 47/00* (2006.01)
(Continued)

(52) U.S. Cl.
CPC ............ *H01H 47/002* (2013.01); *G08B 5/36* (2013.01); *H01H 45/02* (2013.01); *H01H 45/08* (2013.01); *H01H 50/02* (2013.01); *H01H 50/08* (2013.01)

(58) Field of Classification Search
CPC ...... H01H 47/002; H01H 45/02; H01H 45/08; H01H 50/02; H01H 50/08; G08B 5/36
See application file for complete search history.

(56) References Cited

U.S. PATENT DOCUMENTS 3,668,578 A 6/1972 Schroeder
3,809,961 A * 5/1974 Kershaw .............. H02H 11/001
361/50

(Continued)

FOREIGN PATENT DOCUMENTS

DE 3322914.7 6/1983
DE 3340611 12/1984
EP 0060992 2/1982

OTHER PUBLICATIONS

Diagnostic Relay Buddy 12/24 Pro Test Kit—Electronic Specialties 193 Circuit Tester Manual—Jan. 12, 2018.

(Continued)

*Primary Examiner* — Nay Tun
(74) *Attorney, Agent, or Firm* — Ernest D. Buff & Associates, LLC; Ernest D. Buff

(57) ABSTRACT

Testable sealed and/or self-diagnosing electromagnetic or solid-state relays simplify troubleshooting of electrical circuits. The testable relay comprises a relay housing with terminals adapted to connect to a circuit and an opposing top wall with testable terminals formed as projections being flush with or extending from the top wall and being exposed for testing the relay by applying a multimeter device. A self-diagnosing relay comprises a relay housing with terminals adapted to connect to a circuit, and at least two light-emitting diodes (LEDs). One of the LED indicates the relay is energized, and another LED light is a diagnostic LED and indicates if the relay is damaged.

10 Claims, 22 Drawing Sheets

(51) Int. Cl.
*H01H 50/08* (2006.01)
*G08B 5/36* (2006.01)
*H01H 45/02* (2006.01)
*H01H 50/02* (2006.01)

(56) References Cited

U.S. PATENT DOCUMENTS

| | | | |
|---|---|---|---|
| 4,054,932 A * | 10/1977 | Sehmer | H02H 1/00 |
| | | | 361/31 |
| 4,105,968 A * | 8/1978 | Mobley | G01R 19/155 |
| | | | 324/133 |
| 4,127,807 A * | 11/1978 | Peplow | G01R 31/67 |
| | | | 324/508 |
| 4,254,316 A | 3/1981 | Landow | |
| 4,311,961 A | 1/1982 | Holt | |
| 4,713,601 A | 12/1987 | Zahm et al. | |
| 4,788,619 A | 11/1988 | Ott et al. | |
| D314,925 S * | 2/1991 | Murphy | D10/78 |
| 5,139,443 A * | 8/1992 | Armando | H01H 85/0417 |
| | | | 257/E23.044 |
| 5,606,298 A * | 2/1997 | Weiser | H05K 3/308 |
| | | | 335/78 |
| 5,714,886 A * | 2/1998 | Harris | G01R 35/005 |
| | | | 324/601 |
| 5,742,513 A | 4/1998 | Bouhenguel | |
| 6,445,196 B1 * | 9/2002 | White | G01R 29/20 |
| | | | 324/726 |
| 6,563,408 B1 | 5/2003 | Miller | |
| 6,813,129 B2 | 11/2004 | Burdick | |
| 6,952,150 B2 * | 10/2005 | Radosavljevic | H01H 71/20 |
| | | | 335/18 |
| 7,068,038 B2 * | 6/2006 | Mason | G01R 31/69 |
| | | | 324/508 |
| 7,091,723 B2 * | 8/2006 | Simmons | G01R 31/3277 |
| | | | 324/508 |
| 7,528,609 B2 | 5/2009 | Savicki, Jr. et al. | |
| 7,582,989 B2 | 9/2009 | Burr | |
| 8,344,250 B2 * | 1/2013 | Padro | H01H 83/02 |
| | | | 174/53 |
| 8,344,737 B2 * | 1/2013 | Watson | G01R 31/3278 |
| | | | 324/555 |
| 8,861,146 B2 * | 10/2014 | McMahon | H01H 47/22 |
| | | | 361/42 |
| 8,866,345 B1 * | 10/2014 | Wright | H02H 1/043 |
| | | | 307/99 |
| 9,099,258 B2 * | 8/2015 | Padro | H01H 1/26 |
| 9,244,127 B2 | 1/2016 | Wilfred | |
| 9,460,877 B2 | 10/2016 | Ahn | |
| 10,269,516 B2 * | 4/2019 | Aratani | H01H 50/14 |
| 2002/0118495 A1 * | 8/2002 | Beckert | H01H 9/542 |
| | | | 361/2 |
| 2006/0103390 A1 | 5/2006 | Simmons et al. | |
| 2006/0232366 A1 * | 10/2006 | Li | H02H 3/04 |
| | | | 335/151 |
| 2007/0030607 A1 * | 2/2007 | Liscinsky, III | H02H 3/044 |
| | | | 361/42 |
| 2007/0247769 A1 * | 10/2007 | Shi | H02H 3/338 |
| | | | 361/42 |
| 2009/0267629 A1 | 10/2009 | Fong | |
| 2010/0045322 A1 | 2/2010 | Stefano et al. | |
| 2012/0002391 A1 * | 1/2012 | Van Weelden | H02H 3/04 |
| | | | 361/811 |
| 2012/0186956 A1 * | 7/2012 | Padro | H01H 1/26 |
| | | | 200/293 |
| 2012/0320572 A1 * | 12/2012 | Fischer | F21V 19/002 |
| | | | 362/183 |
| 2014/0097850 A1 | 4/2014 | Law | |
| 2015/0370260 A1 | 12/2015 | Takijiri et al. | |
| 2019/0008008 A1 * | 1/2019 | Zhu | H05B 45/44 |

OTHER PUBLICATIONS http://www.tooldiscounter.com/ItemDisplay.cfm?lookup=ESP193 &source=froogle&kw=ESP193&gclid=EAla . . . Jan. 12, 2018.

* cited by examiner

TESTABLE SEALED RELAY AND SELF-DIAGNOSING RELAY

CROSS-REFERENCE TO RELATED APPLICATIONS

This application is a divisional of applicants' co-pending U.S. patent application Ser. No. 16/010,903 filed Jun. 18, 2018 entitled "Testable Sealed Relay And Self-Diagnosing Relay", the disclosure of which is hereby incorporated in its entirety by reference thereto.

1. FIELD OF THE INVENTION

This invention relates to relays for electrical circuits; and, more particularly, to relays and/or systems that enable testing and/or self-diagnosis of a relay and/or upstream device in a circuit.

2. DESCRIPTION OF THE PRIOR ART

An automobile is a complex machine whose intricacy continues to grow with innovation. While our grandfathers only need sandpaper, a wrench, and a screwdriver to fix any vehicle, repairing a modern automotive requires an advanced education in diagnostics and specialized tools. Relays, or electrically operated switches, are widely utilized in automobiles or vehicles for switching a circuit with a heavy load (on and off), conserving energy, prolonging the life of devices and improving device efficiency. Through the use of relays, a heavy electrical load drawing heavy current can be switched on and off by applying a small amount of current through a coil (solenoid). The coil is magnetized with the current and attracts or repels a plunger (a rod passed through the coil), either connecting two switching contacts in the relay or separating them. After the current stops, the main contacts return to their original position. In automobile applications, relays of different configurations with single or multiple contacts are used for different applications. Relays are typically used in circuits where manual switching is used for direct switching of a lamp or motor or any gadget exceeding ten (10) Amps of load. Some of the most popular circuitry in automobiles utilizing relays include fuel pumps; heated mirrors; blower motors; starters; radiator cooling fan motors; driving lights; horns; A/C compressor controls; A/C clutches; headlights; fog lamps; and other multiple-purpose relays. Current relay constructs in the marketplace typically include bottom terminals and a solid top cover.

There generally is no direct method for testing these existing relay functions while installed in vehicle. Instead, a technician typically needs to remove the relay in order to conduct testing which requires dual tests: one on the relay and one on the vehicle. When an upstream device in a circuit, such as those aforementioned, fails to operate properly, the mechanic or person repairing the vehicle, must remove each relay to determine if: 1) the relay is bad/damaged and needs replacing, and/or 2) if the relay is still good/operating, but the circuit is damaged; and/or 3) perform testing on the vehicle device's circuit. Frequently, over time coils in the relay may become damaged, and or the contacts become dirty. As a result, the mechanic must manually remove each relay and either test it with a multimeter device or replace it with a new relay to determine if the replacement cures the problem. Both these methods in testing relays can be time-consuming, frustrating and costly.

Various examples of relays heretofore disclosed and utilized are provided below:

U.S. Pat. No. 3,668,578 to Schroeder discloses a lightweight hermetically sealed electromagnetic relay having an electromagnet, an armature, and a contact assembly. An isolation barrier is interposed between the electromagnet assembly and the armature and contact assemblies and is arranged to support each of the assemblies. A transparent cover is bonded to the isolation barrier and protects the electrical contacts against external contamination from the operating environment as well as against internal contamination from impurities emitted by the coil insulation material.

U.S. Pat. No. 4,254,316 to Landow discloses an electromagnetically operated contactor or relay employing contact modules which are removably mounted in either of two positions respectively providing normally open and normally closed contact conditions. One set of contact modules is mounted in a main frame and a second set is mounted in an upper frame which overlies the main frame and obscures the first set of contact modules. Transparent viewing members extend through apertures in the upper frame. Each transparent viewing member has a viewing surface exposed externally of the upper frame and an image transmitting surface adjacent to a contact module of the underlying first set. Each contact module has two light reflecting surface areas which are distinguishable from each other, one or the other being adjacent to the image transmitting surface of the associated transparent viewing member depending upon the position of the contact module. Thus, the images of the light reflecting surface areas appearing at the viewing surfaces of the transparent viewing members provide visual indications of the positions and consequently the normal contact conditions of the underlying contact modules.

U.S. Pat. No. 4,311,961 to Holt et al. discloses an apparatus for testing enclosed electromagnetic relays including a probe displaceable into the relay enclosure to engage the movable contact thereof. The probe is associated with a force transducer and a displacement transducer which provide inputs to a circuit including microprocessor unit which operates to detect the probe force required to break contact between the movable contact and the normally closed contact and to detect the position of the probe when such break occurs and when the normally open contact is made and to calculate the contact travel from the position signals it receives. Contact over travel is also measured by applying current to the relay winding and measuring probe displacement required to re-engage the contact.

U.S. Pat. No. 4,788,619 to Ott et al. discloses a protective relay for use in an electrical power system having electrical conductors which are energizable with an AC voltage. The protective relay includes a circuit for sensing the AC voltage to produce an AC output that has zero crossings and a time period between zero crossings, a circuit for supplying an electrical signal representing a preselected pickup value of volts-per-Hertz for the relay, and a circuit responsive to the AC output and to the electrical signal for generating an electrical level as a function of both the time period and the pickup value and for producing an output signal for the relay when the AC output exceeds the electrical level. In this way, the output signal is produced when a volts-per-Hertz value of the AC voltage exceeds the preselected pickup value of volts-per-Hertz for the relay. Other protective relay apparatus and methods are also disclosed.

U.S. Pat. No. 5,742,513 to Bouhenguel et al. discloses a system and method for automatically testing the operation of a protective relay system. The system and method provide for continuous testing to ensure proper operation of the protective relay system while the relay remains in service and without interrupting the normal operation of the relay. This testing is performed by storing reference data corresponding to test signals, generating test signals, sampling a specific test signal, processing that test signal through the relay and comparing the processed test signal with the corresponding reference data. Upon detection of an error in the relay, the system and method further provide for isolation of the relay from the electric power system and automatic testing of individual electrical components within the protective relay system to determine the identity of the malfunctioning component. The method of determining the malfunctioning component requires: selecting a component for testing, generating a test signal, providing the test signal as an input to the selected component, processing the test signal through the selected component and the subsequent component in the protective relay system and comparing the processed test signal with corresponding reference data. Finally, the system and method further provide for automatic correction of the malfunctioning component, if possible.

U.S. Pat. No. 6,563,408 to Miller discloses a diagnostic relay having a casing mounted on a relay base and enclosing components of the relay. The casing includes a top wall having a plurality of apertures. The apertures are aligned with contacts inside the casing. The contacts are integral with or electrically connected to relay prongs traversing the base. A diagnostician replaces a circuit relay with the diagnostic relay, then inserts probes of a circuit tester through selected apertures into engagement with the contacts to determine the location of faults in the circuit. In one embodiment, the casing is clear or transparent so the diagnostician may observe whether moving components of the diagnostic relay are operating properly.

U.S. Pat. No. 6,813,129 to Burdick discloses a self-diagnostic solid state relay for converting a low current input into a high current output and providing the combined functions of silent switching and visual indication of circuit status. A three-dimensional polygonal shaped housing encloses a printed circuit board. A MOSFET field effect transistor, a pair of female circuit board terminals, and a pair of LED elements are electrically communicable with a first side of the printed circuit board, the LED elements further being viewable from an exterior location of the housing. A fuse including first and second spaced apart and extending blade portions engage, respectively, with the first and second female terminals through openings defined in the housing. A plurality of male circuit board terminals are in electrical communication with a second side of said printed circuit board and extend from further selected exterior locations of the housing. The first LED element illuminates to indicate an open circuit due to an open OCPD operating condition of the relay, whereas the second LED element illuminates to indicate a partial or total open load circuit operating condition.

U.S. Pat. No. 7,582,989 to Burr discloses methods, apparatus, and articles of manufacture related to safety relays having independently testable relay contacts. In one disclosed example, a safety relay includes a plurality of relay coils, each of which is coupled in parallel to a first node via a respective one of a plurality of switches. The disclosed example also includes and a plurality of relay contacts, each of which corresponds to a respective one of the plurality of relay coils. The relay contacts of the safety relay are coupled in series and independently controllable by respective ones of the switches.

U.S. Pat. No. 9,244,127 to Wilferd discloses a quick reference diagnostics of an automotive individual electrical circuit by replacement of the OEM relay with a diagnostics relay incorporating a series of LED bulbs designed to illuminate individually upon completion of each internal switching function. Adjacent to an LED is a voltage portal which allows measurement of voltage during each function stage of relay switching.

U.S. Patent App. Pub. No. 20090267629 to Foong discloses testing of IC devices, and more specifically to a contact (11) for a test socket (1) for interfacing pads/leads (21) of the IC devices (2) with a printed circuit board (3) of a test handler. The contact (11) comprises a contact body (12), a first arm (13) adapted for electronically engaging the pads/leads (21) and a second arm (14) adapted for electronically engaging the corresponding terminals (31) on the printed circuit board (3). The first engaging means (15) is provided with a sliding means for improved sliding action between the contact (11) and the pads/leads (21). The sliding means enable a single contact to be used for various IC devices and also protects the pads/leads (21) and contacts (11) of the test socket (1) from damage and extensive wear.

U.S. Patent Application Publication No. 20100045322 to Di Stefano et al. discloses a probe head for contacting microelectronic devices substantially lying in a test plane, the probe head including: (a) one or more substrate tiles having one or more probe tips disposed on a top surface thereof; and (b) a registration-alignment apparatus that holds the one or more substrate tiles: (i) in position so that the one or more probe tips are held in the test plane, and (ii) aligned so that the one or more probe tips are substantially coplanar to the test plane, which registration-alignment apparatus includes: (i) one or more capture elements affixed, directly or indirectly, to a frame; (ii) three or more posts mechanically supporting each of the one or more substrate tiles; and (iii) alignment actuators affixed, directly or indirectly, to the frame and the posts, which alignment actuators may be actuated to enable the posts to move in response to forces applied thereto from the one or more substrate tiles, and may be actuated to prevent the posts from moving.

U.S. Patent Application Publication No. 20140097850 to Law et al. discloses terminal blocks including integral safety relays having independently testable contacts. An example apparatus includes a terminal block body couplable to an electronics cabinet or mounting rail. The terminal block body includes a first slot to receive a first circuit and a second slot to receive a second circuit. The apparatus includes a first contact and a second contact that are externally accessible when the terminal block body is coupled to the electronics cabinet or the mounting rail. The apparatus includes a first switch and a second switch to selectively couple the first contact and the second contact and a test point coupled between the first switch and the second switch. The test point is to enable the first switch and the second switch to be independently testable to verify operability when the terminal block body is coupled to the electronics cabinet or the mounting rail.

U.S. Patent Application Publication No. 20150370260 to Takijiri et al. discloses a relay making it possible to diagnose an operation state of a fluidic device despite reducing the size of the fluidic device, a relay is configured to include a first port connected with the fluidic device and a second port connected with a user information processor, and receive fluid-related data from the fluidic device via the first port and transmit the data to the user information processor via the second port, or receive the data from the user information processor via the second port and transmit the data to the fluidic device via the first port. In addition, the relay includes a third port that is connected with a diagnostic apparatus adapted to diagnose the operation state of the fluidic device, receive diagnostic data from the fluidic device via the first port, and transmit the diagnostic data to the diagnostic apparatus via the third port.

Foreign Patent Publication No. DE3340611 to Benson et al. discloses an improved electronic relay switch for a testable physically separated control circuit according to German Patent Application P 3322914.7. The relay switch contains, in particular, an input frequency detector circuit. Switch elements have a first and a second number of HEXFET transistors which have drain connection leads that are connected to a first circuit point and/or a second circuit point. The switch elements have source connection leads which are connected to the separate earth terminals, and have gate connection leads which are connected to the rectifier circuit. A rapid cut-off circuit is connected between the rectifier circuit and the gate connection leads. The operation checking circuit has a current sensing transformer with two windings. The first winding is connected in series between the first circuit point and second circuit point and the second winding is connected in series between one of the separate earth terminals and the input filter. With this arrangement, the current in the first winding controls the voltage on the second winding, and the voltage controls the optical operation checking signal.

Foreign Pat. Pub No. EP0060992 to Kammerer et al. discloses a testing and evaluating circuit for a proximity switch in control systems for machines.

Publication entitled "Diagnostic Relay Buddy 12/24 Pro Test Kit" found at http://www.tooldiscounter.com/ItemDisplay.cfm?lookup=ESP193&source=froogle&kw=ESP193&gclid=EAIaIQobChMI3v2Wz8XT2AIVHbbA Ch3kywk2EAQYASABEgLbOPD_BwE discloses a diagnostic relay buddy pro test kit for testing both 12V and 24V relays.

Publication entitled "Relay Circuit Diagnostic . . . " found at https://www.cpooutlets.com/on/demandware.static/-/Sites-cpo-master catalog/default/dw345aeacb/product_media/atd/atdn5614/documents/atdn5614_manual.pdf discloses a relay circuit diagnostic tester.

Notwithstanding the aforesaid prior art teachings, there remains a need in the art for a testable sealed relay and/or a self-diagnosing relay that can be used to simplify troubleshooting of electrical circuits. There additionally remains a need in the art for a testable sealed relay that provides a testable exterior surface-accessible flush or protruding tines or prongs that facilitate testing of a relay. Furthermore, there remains a need in the art for a self-diagnosing relay that readily validates the operation of the relay or circuitry by LED light indication.

SUMMARY OF THE INVENTION

The present invention provides a testable sealed relay and a self-diagnosing relay that can be used to simplify troubleshooting of electrical circuits. The subject testable sealed relay provides testable exterior surface-accessible flush or protruding tines or prongs, or a plug for use with a diagnostic tool of the subject invention that facilitate testing of a relay with multimeter. Also provided is a self-diagnosing relay that validates operation of the relay or circuitry by LED light indication.

In a first embodiment, a testable sealed relay is provided. The testable relay comprises a relay housing having a bottom wall with pins/terminals adapted to connect to a circuit, side walls, and an opposing top wall forming a cavity with electrical and contact components for carrying a current. Direct, testable terminals located in the top wall directly correspond to and are in electrical communication with the bottom wall terminals. The testable terminals are formed as projections that are flush with or extend from the top wall and are exposed to facilitate testing the relay by applying a multimeter device to test the voltage. As a result, the subject testable relay allows the relay terminals to be tested while the relay is still installed, thereby eliminating the need to remove the relay. This enables the technician not only to determine if the contacts in the relay are working, but also to test the circuit. This design is universal and can be used on all models of relays. The electrical components may comprise an electromagnetic coil. Alternatively, the electrical components may comprise an SSR device providing a solid-state relay. The relay preferably has 4 or 5 pins/terminals.

A self-diagnosing relay is also provided. The self-diagnosing relay comprises a relay housing having a bottom wall with pins/terminals adapted to connect a circuit, side walls, and an opposing top wall forming a cavity with electrical components for carrying a current. A contact circuitry in electrical connection to the components is provided having at least two light-emitting diodes (LEDs), wherein one green LED (preferably) indicates a primary signal that the relay is energized, and another LED light is a diagnostic red LED (preferably) and indicates if the relay is damaged. The top wall includes apertures corresponding to each LED so that each LED is visible and adapted to be seen by a user. The electrical components may comprise a mechanical/electromagnetic coil. Alternatively, the electrical components comprise an SSR device. Preferably the housing is transparent so that the housing lights up and the LED is immediately seen no matter what angle the user is at. There may be two or more diagnostic LEDs for diagnosing terminal connections. A push-button contact may be provided for testing circuitry connectivity of one or more of the terminals. The testable sealed relay may comprise single contact circuitry in electrical connection to the components and the LEDs, wherein one LED light indicates that the primary/signal/coil is energized, validating a normally open (NO) contact, and another LED light indicates if NO and/or a normally closed (NC) contact it bad when the primary circuit is activated. The testable sealed relay may comprise a dual contact circuitry in electrical connection with the components and the LEDs, wherein one LED light indicates that the primary/signal/coil is energized, validating a normally open (NO) contact, and another LED light includes an extra contact that pulls power from a primary terminal and illuminates if the NO and/or NC contacts are bad when the primary circuit is activated. A testable relay tool for testing a relay is also provided. The testable relay tool comprises a top wall having row of (+) Light Emitting Diodes (LED) and (−) LED indicators viewable from said top wall; each row of said (+) LED and (−) LED corresponds or aligns with terminals; a test button is provided that for feeding energy to one or more of said terminals; a (+) and (−) connection means for connection of said testable relay tool to a power source; and a relay plug adapted to be plugged in to a mating plug or a relay to test a relay. The testable relay tool may further include a testable relay insert adapted to plug into and be inserted between said relay and circuit to modify said relay so that it is testable with said testable relay tool.

BRIEF DESCRIPTION OF THE DRAWINGS

The invention will be more fully understood, and further advantages will become apparent when reference is had to the following detailed description of the preferred embodiments of the invention and the accompanying drawing, in which:

FIG. 1b illustrates a top plan view of the testable relay of FIG. 1a;

FIG. 6b illustrates a top plan view of the self-diagnosing relay of FIG. 4a;

FIG. 7b illustrates a top plan view of the self-diagnosing relay of FIG. 7a;

FIG. 16b illustrates an alternative relay circuitry of FIG. 16a;

FIG. 17b illustrates an alternative relay circuitry of FIG. 17a;

DETAILED DESCRIPTION OF THE INVENTION

The subject invention provides a testable sealed relay and a self-diagnosing relay, and/or combinations thereof, adapted to simplify and create more transparency around the process of troubleshooting electrical circuits. In a first broad embodiment, a testable sealed relay is provided.

In a first embodiment, a testable sealed relay is provided that modifies current relay designs with direct, testable connections There are at least two models of the subject invention that can achieve this. In the first, these testable connections are either substantially flush with or protruding slightly from the top that feed to the corresponding bottom terminals, thereby enabling the relay to be tested while still installed in the vehicle. In a second, a plug would enable direct testing with the use a relay tool. In another broad embodiment, a self-diagnosing relay is provided that includes light-emitting diodes (LEDs) that light up to indicate operation of the relay and/or upstream circuitry and devices. Preferably, the self-diagnosing relay utilizes voltage drop to indicate functions. Color-coded LED lights are provided that illuminate to signal where connections are faulty, enabling a technician to easily pinpoint where a repair is needed. Both designs seek to enhance the automotive technician's ability to repair electrical circuit problems by reducing the time spent on initial diagnosis.

The subject relay has great potential for mainstream adoption and the ability to become a new industry standard and can be utilized in a plethora of relay configurations. Non-limiting examples of contemplated relay configurations for use in automobiles include: fuel pumps; heated mirrors; blower motors; starters; radiator cooling fan motors; driving lights; horns; A/C compressor controls; A/C clutches; headlights; fog lamps; and other multiple-purpose relays. The subject relay also has applications in other technologies including, for non-limiting example: fire safety, networking security systems, and other systems that utilize relay devices. The Figures illustrate various embodiments of the relay apparatus and methods for using them.

Figure 1A:
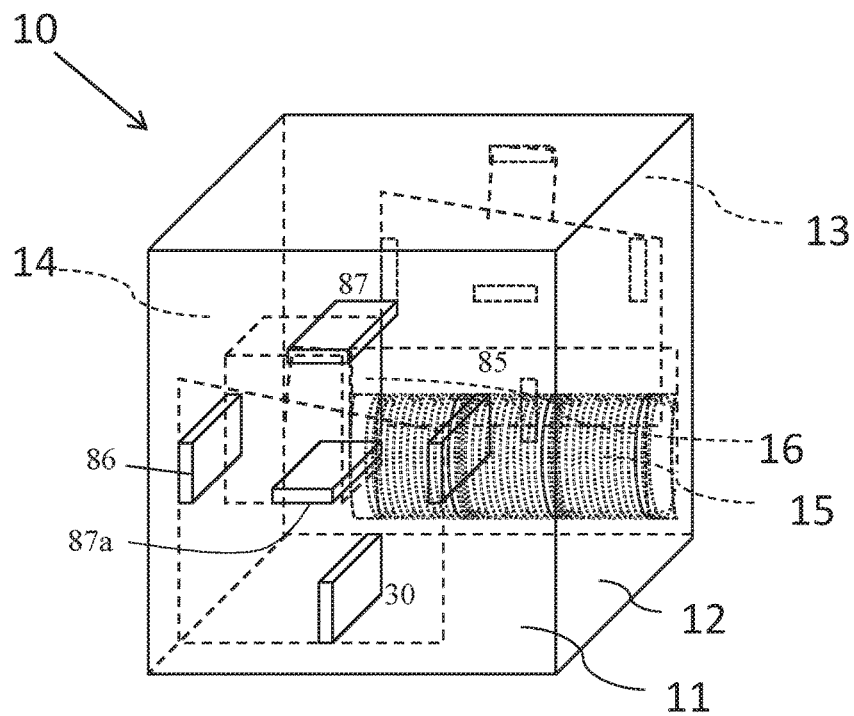
FIG. 1a illustrates a bottom plan view of an embodiment of the testable relay.
Figure 1B:
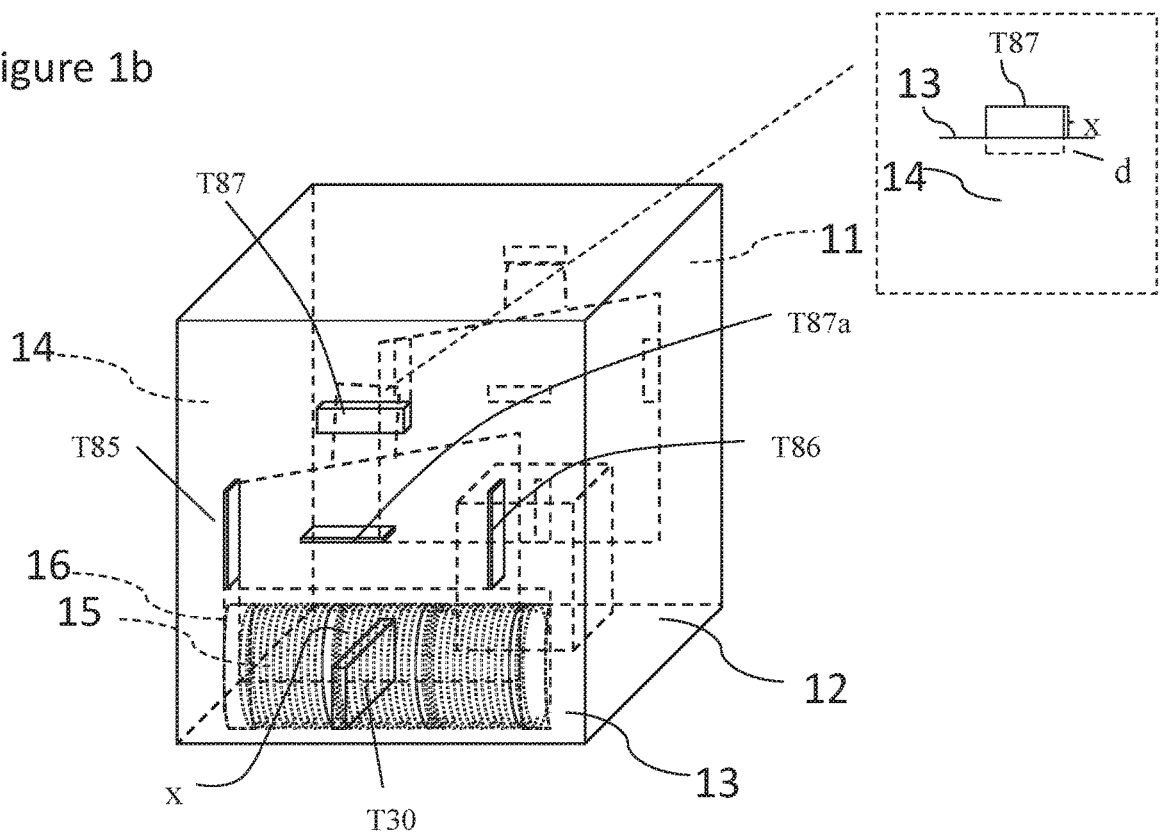
Figure 2A:
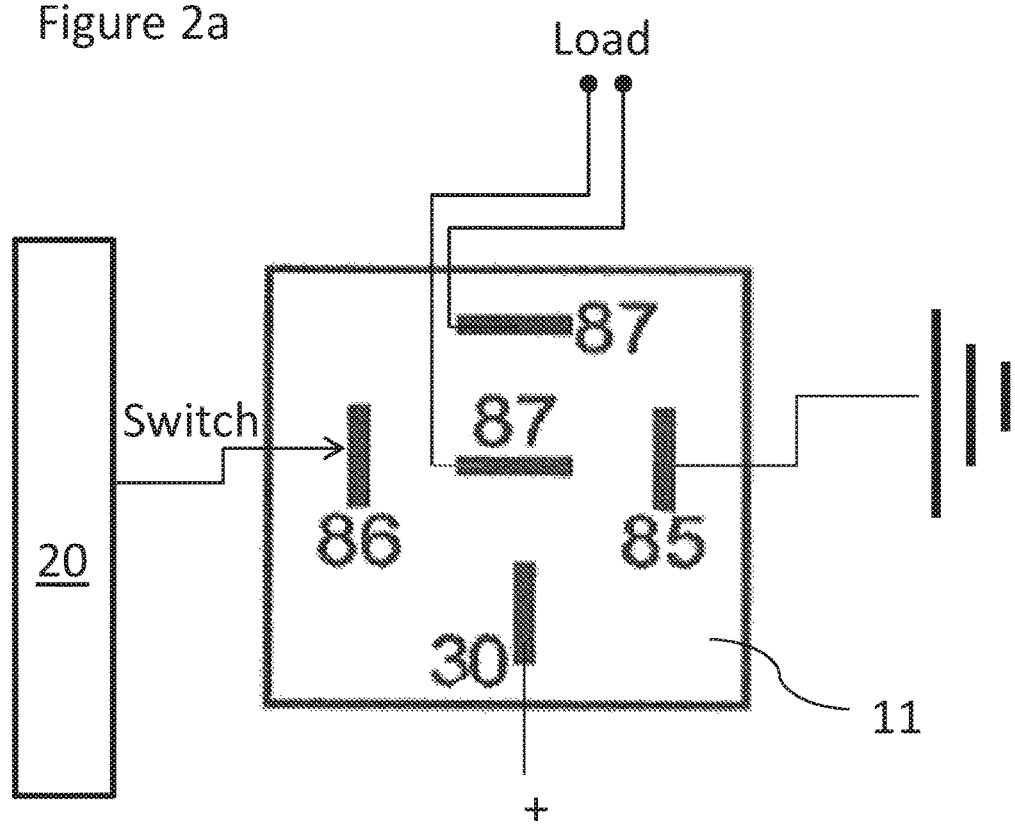
FIG. 2a illustrates a plan view of the bottom wall of the relay of FIGS. 1a, 1b.
Figure 2B:
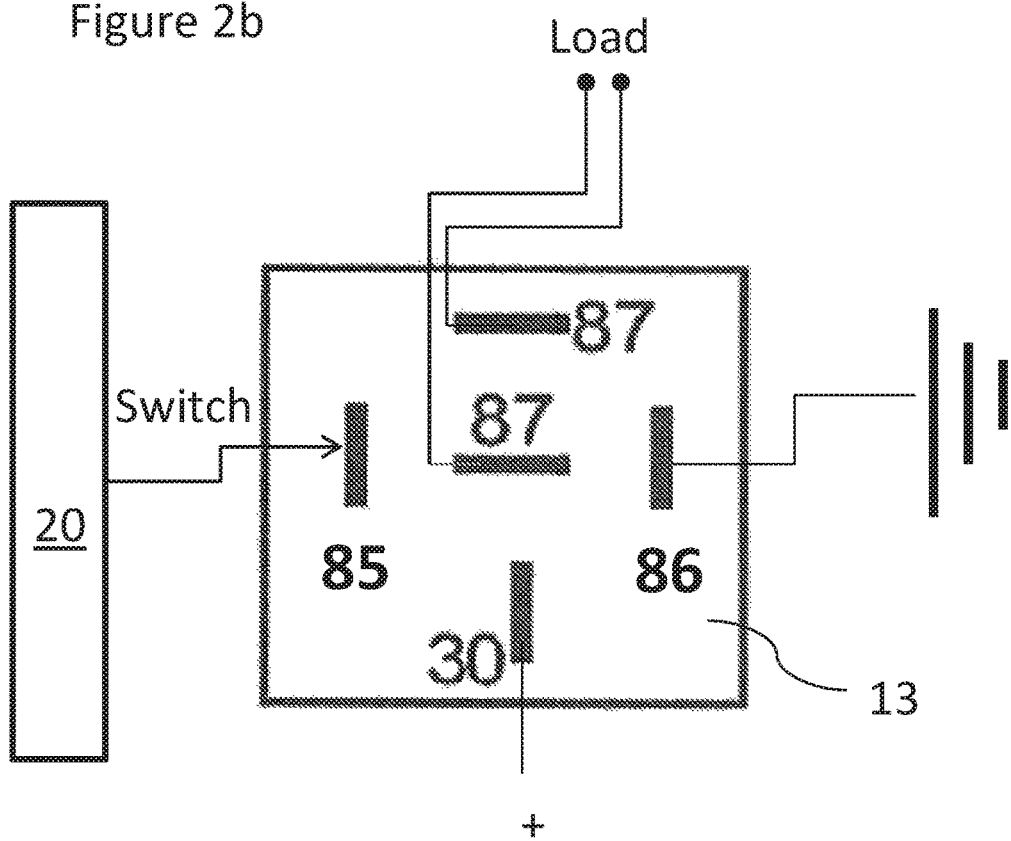
FIG. 2b illustrates a plan view of the top wall of the relay of FIGS. 1a, 1b.

FIGS. 1a, 1b, 2a and 2b illustrate a first broad embodiment of a testable relay of the subject relay invention. FIG. 1a illustrates a bottom plan view of the testable relay. FIG. 1b illustrates a top plan view of the testable relay. FIG. 2a illustrates a plan view of the bottom wall of the relay of FIGS. 1a, 1b. FIG. 2b illustrates a plan view of the top wall of the relay of FIGS. 1a, 1b.

Referring to FIGS. 1a-2b, the testable relay 10 has a relay housing including a bottom wall 11 with 5 terminals (herein exemplarily shown Boss 5 relay style; it is noted the testable relay may instead be constructed as a 4 pin relay), side walls 12, and an opposing top wall 13 forming a cavity 14. Terminals include 30, 85, 87a, 87 and 86. Terminal 30 is connected to a battery 20. Terminal 85 is connected to the ground. Terminal 86 is connected to the upstream device switch (i.e., headlight, fog light, horn, A/C, etc.). Terminals 87a and 87 are connected and deliver amperage to the device. Cavity 14 houses an inductor or coil 15 in communication with a switch contact 16. Coil 15 is connected to terminals 86 and 85 so that when current is delivered through coil 15 via terminals 86 and 85 a magnetic field is generated, pulling switch contact 16 from an open position to a closed position.

Unlike conventional relays, the subject testable sealed relay has direct, testable terminal connections, prongs or tines protruding from the top wall 13 of the relay. These direct, testable terminal connections, prongs or tines or plug are indicated at T85, T30, T86, T87 and T87a, which directly correspond in electrical communication with terminals 85, 30, 86, 87a, and 87 located on the bottom wall 11. These top wall 13 terminals 85, 30, 86, 87 and 87a are exposed by either laying flush with the top wall 13 or slightly protruding from the top wall 13, so that a technician can easily test the relay by applying a multimeter device to test the ohmage or voltage. Preferably, the terminals or tines T85, T30, T86, T87 and T87a are located substantially flush with or only slightly indented into the top wall 13 so that they can be readily accessed and tested. If the terminals are located within holes or apertures that extend too deep into the relay from the top surface, not only would it be difficult to access the terminals for testing, but dirt, debris, and grease will accumulate in the apertures making the terminals untestable or causing testing inaccuracy. The subject testable relay allows the relay terminals to be tested while the relay is still installed, thereby eliminating the need to remove the relay. This enables the technician not only to determine if the contacts in the relay are working but also to test the circuit. This design is universal and can be used on all models of relays. The testable relay may comprise a coil for a mechanical relay as discussed herein or can alternatively be constructed as a solid-state relay (SSR).

The testable relay provides testability without removal of the relay from the electric component. Herein the top wall 13 is disclosed as having corresponding terminals 85, 30, 86, 87a and 87 presented as terminal prongs or tines extending from top wall 13 at a distance "x" which preferably ranges from 0.001 to 0.5 inches so that the prongs/tines are readily accessible, but do not protrude too far from the top wall 13. However, it is noted that these terminal prongs or tines may be presented as flat prongs flush with the top wall, or as tines extending from the top wall. The projections may be shallow projections flush on a horizontal plane of the top wall so that the projections do not protrude from the top wall. Alternatively, the projections may be shallow projections extending downward into the cavity of the relay housing at a depth "d" from the top wall of relay housing, wherein d ranges from 0.001 to 0.02 inches.

Figure 3:
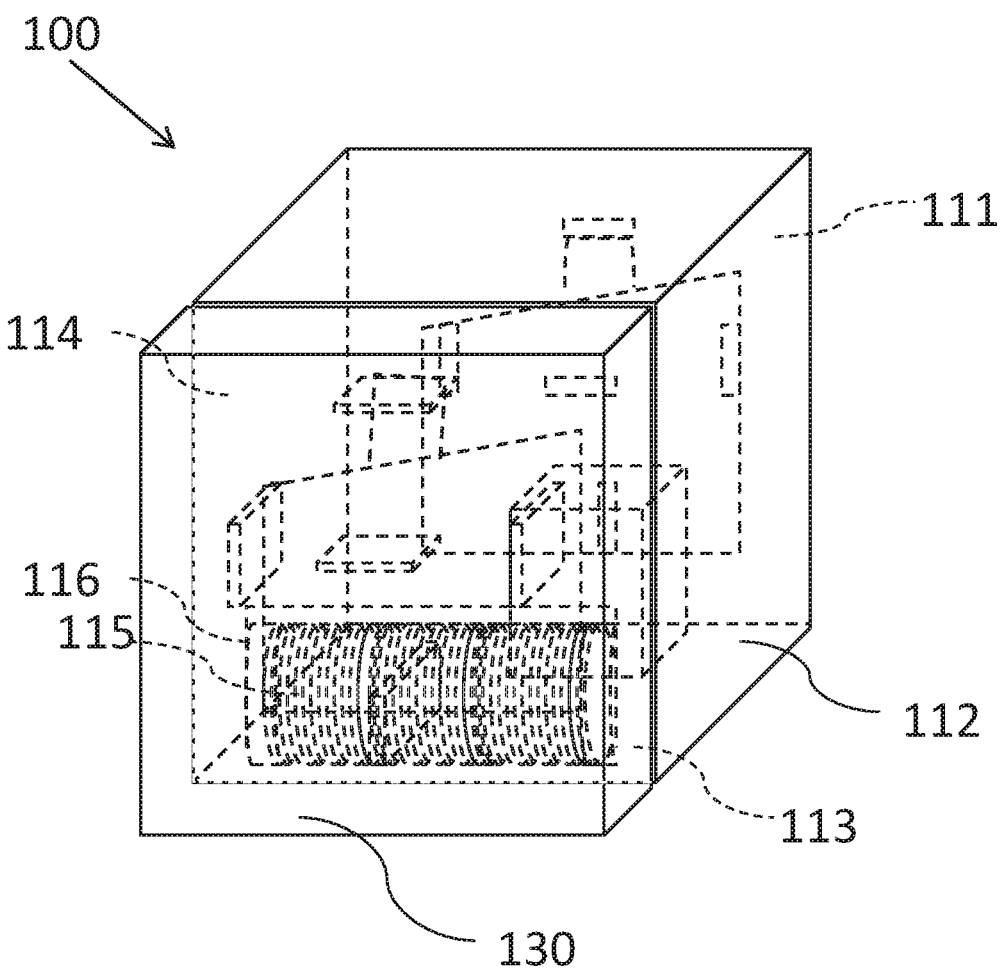
FIG. 3 illustrates an optional top wall cover for the embodiment of FIGS. 1a-2b.

FIG. 3 illustrates an optional top wall cover for the embodiment of FIGS. 1a-2b. The testable relay 100 is constructed having a relay housing having a bottom wall 111 with 5 terminals (herein exemplarily shown Boss 5 relay style), side walls 112, and an opposing top wall 113 forming a cavity 114. Terminals include 30, 85, 87a, 87 and 86 as discussed hereinabove regarding FIGS. 1a-2b. Cavity 114 houses an inductor or coil 115 in communication with a switch contact 116. Direct, testable terminals connections are located on the top wall 113 of the relay via terminals 85, 30, 86, 87 and 87a which directly correspond in electrical communication with terminals 85, 30, 86, 87a, and 87 located on the bottom wall 111. These top wall 113 terminals are exposed so that a technician can easily test the relay by applying a multimeter device to test the ohmage or voltage. A cover 130 is provided over the top wall terminals to prevent the top wall terminals from being damaged or becoming dirty. Cover 130 may simply be removed by snapping same off the relay, or may be hingedly connected to the relay so that it may be opened to provide access.

Figure 4A:
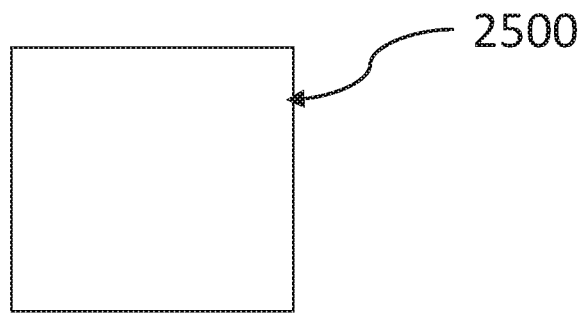
FIG. 4a is a top view of an embodiment of a testable relay.
Figure 4B:
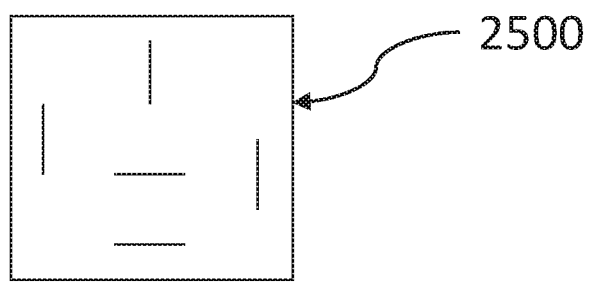
FIG. 4b is a bottom view of an embodiment of a testable relay.
Figure 4C:
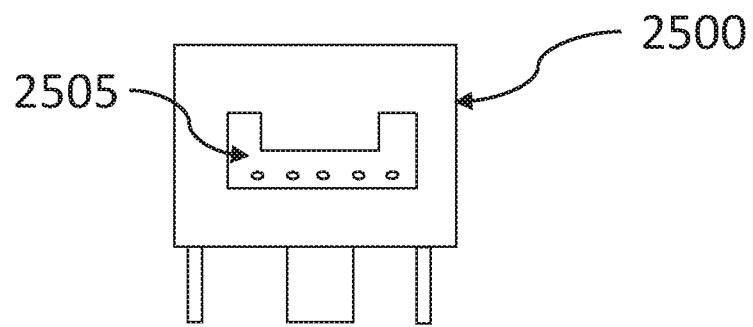
FIG. 4c is a side view of an embodiment of a testable relay with a plug for use with a testable relay tool.

FIGS. 4a-4c illustrate views of a testable relay that can be used in conjunction with a testable relay tool. FIG. 4a is a top view of an embodiment of any representative relay 2500. FIG. 4b is a bottom view of the relay 2500. FIG. 4c is a side view the relay 2500 with a plug 2505. Advantageously, plug 2505 enables the relay and the circuit to be tested with the testable relay tool (shown in FIG. 21 and FIG. 22).

Figure 5:
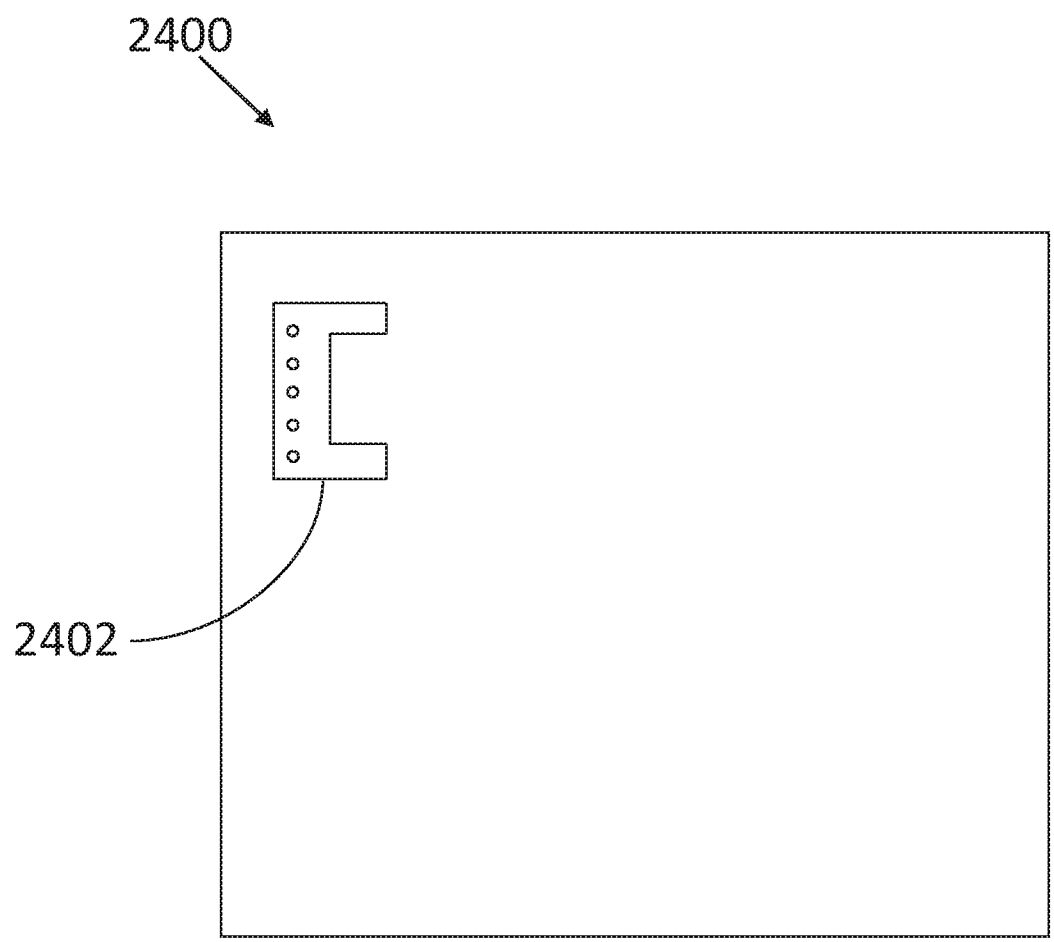
FIG. 5 is a top view of a plug that can be tested with a relay or with the testable relay tool of FIG. 22.

FIG. 5 shows an alternative top view of FIG. 4a with a plug 2402 on top instead of on the side for testing with a relay or with a testable relay tool, shown generally at 2400.

Figure 6A:
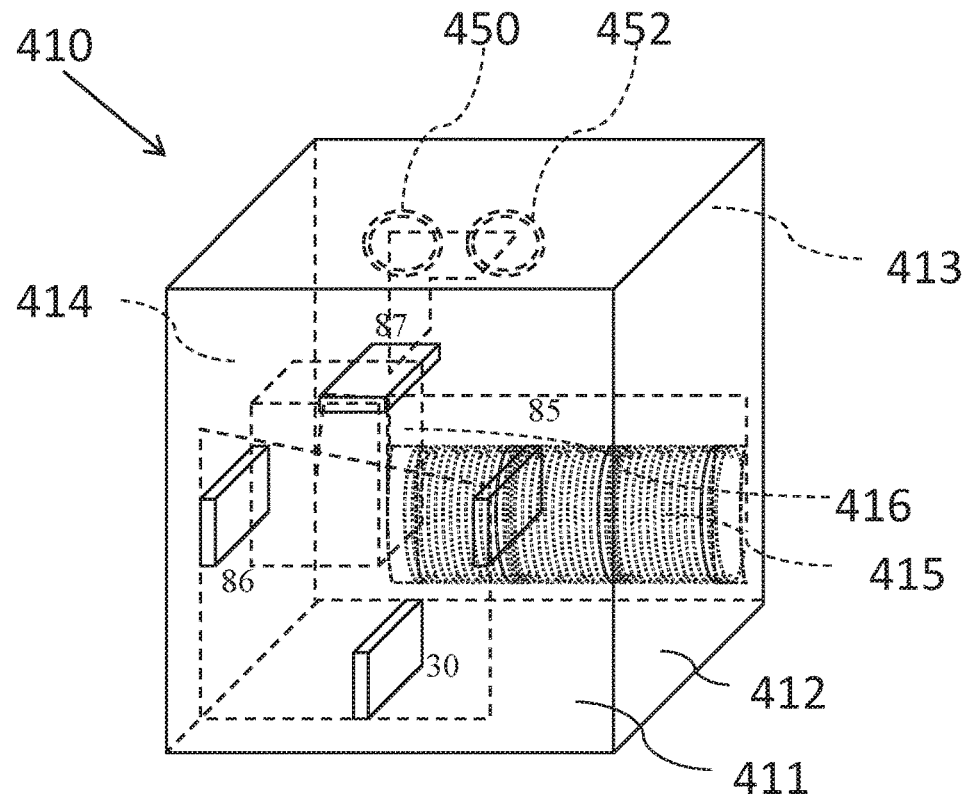
FIG. 6a illustrates a bottom plan view of an embodiment of a self-diagnosing 4 pin relay.
Figure 6B:
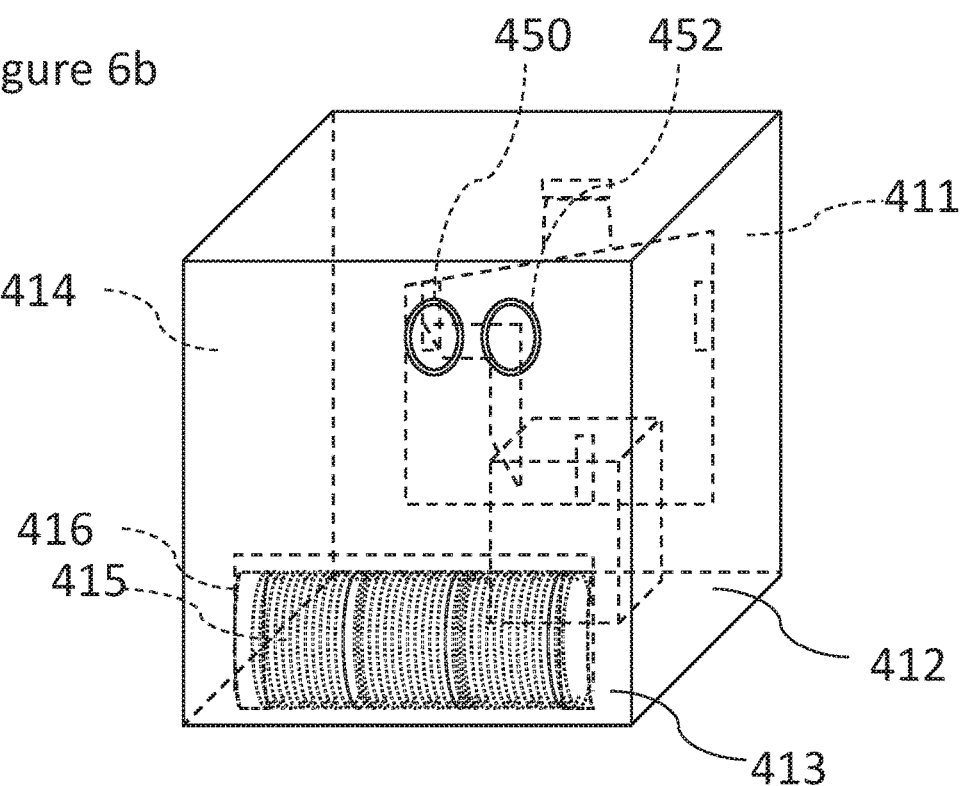

FIGS. 6a, 6b, illustrate an embodiment of a self-diagnosing relay of the subject relay invention, showing a four pin relay. FIG. 6a illustrates a bottom plan view of an embodiment of a self-diagnosing 4 pin relay. FIG. 6b illustrates a top plan view of the self-diagnosing relay of FIG. 6a.

Referring to FIGS. 6a-6b, in the embodiment shown, the self-diagnosing relay includes either single or dual contacts. Voltage drop is utilized to indicate functions. The self-diagnosing relay 410 comprises a relay housing having a bottom wall 411 with 4 terminals (herein exemplarily shown Boss 4 relay style), side walls 412, and an opposing top wall 413 forming a cavity 414. Terminals include 30, 85, 87 and 86. Terminal 30 is connected to a battery. Terminal 85 is connected to the ground. Terminal 86 is connected to the device switch (i.e., headlight, fog light, horn, A/C, etc.). Terminal 87 deliver amperage to the device. Cavity 414 houses an inductor or coil 415 in communication with a switch contact 416. Coil 415 is connected to terminals 86 and 85 so that when current is delivered through coil 415 via terminals 86 and 85 a magnetic field is generated, pulling switch contact 416 from an open position to a closed position. Unlike conventional relays, the subject self-diagnosing relay has LEDs that indicate if the primary/signal/coil 415 is being energized. A green LED, shown at 450, illuminates if the primary/signal/coil is being energized. A red LED, shown at 452 illuminates if the normally open (NO) contacts are bad (87, 30) when the primary circuit (86, 85) is activated. Preferably, top wall 413 is composed of a clear transparent plastic to enhance visibility of the LEDs. Alternatively, top wall 413 includes corresponding apertures with a clear transparent screen over the LEDs for visibility.

Figure 7A:
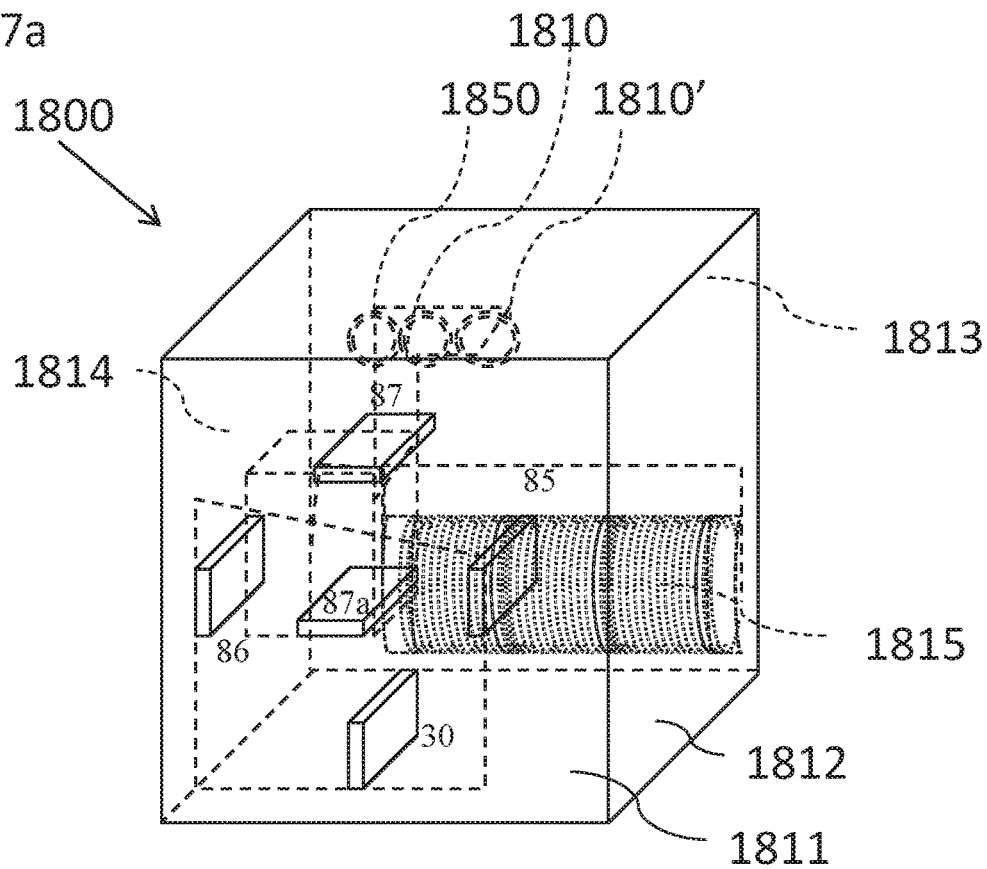
FIG. 7a illustrates a bottom plan view of an embodiment of a self-diagnosing 5 pin relay.
Figure 7B:
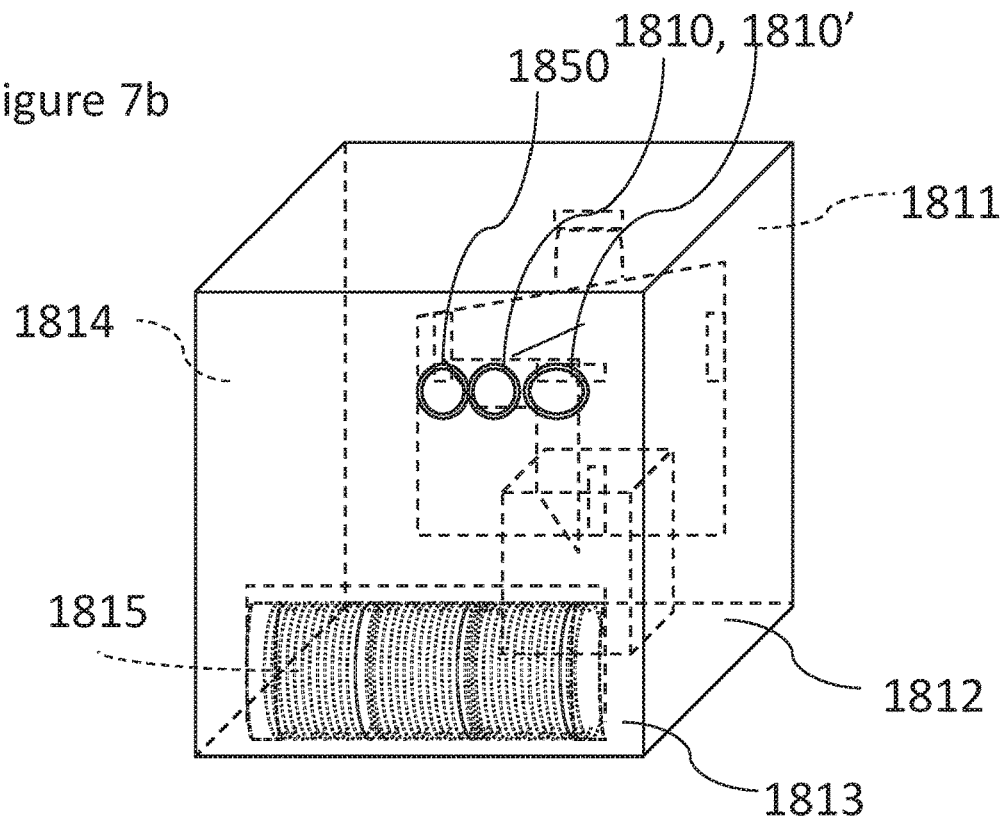

FIG. 7a illustrates a bottom plan view of an embodiment of a self-diagnosing 5 pin relay, shown generally at 1800. FIG. 7b illustrates a top plan view of the self-diagnosing relay of FIG. 7a. In the embodiment shown, the self-diagnosing relay 1800 comprises a relay housing having a bottom wall 1811 with 5 terminals (terminals 30, 85, 86, 87a and 87), side walls 8112, and an opposing top wall 1813 forming a cavity 1814. Terminal 30 is connected to a battery. Terminal 85 is connected to the ground. Terminal 86 is connected to the device switch (i.e. headlight, fog light, horn, A/C, etc.). Terminals 87 and 87a are connected and deliver amperage to the device. Cavity 1814 houses an inductor or coil 1815 in communication with a switch contact. Coil 1815 is connected to terminals 86 and 85 so that when current is delivered through coil 1815 via terminals 86 and 85 a magnetic field is generated, pulling switch contact from an open position to a closed position. Alternatively, the relay may be an SSR configuration that utilizes the circuitry discussed hereinabove. A green LED, shown at 1850, illuminates if the contacts are good. Two red LEDs 1810, 1810' illuminate if the contacts in the relay are damaged or need replacement.

Figure 8:
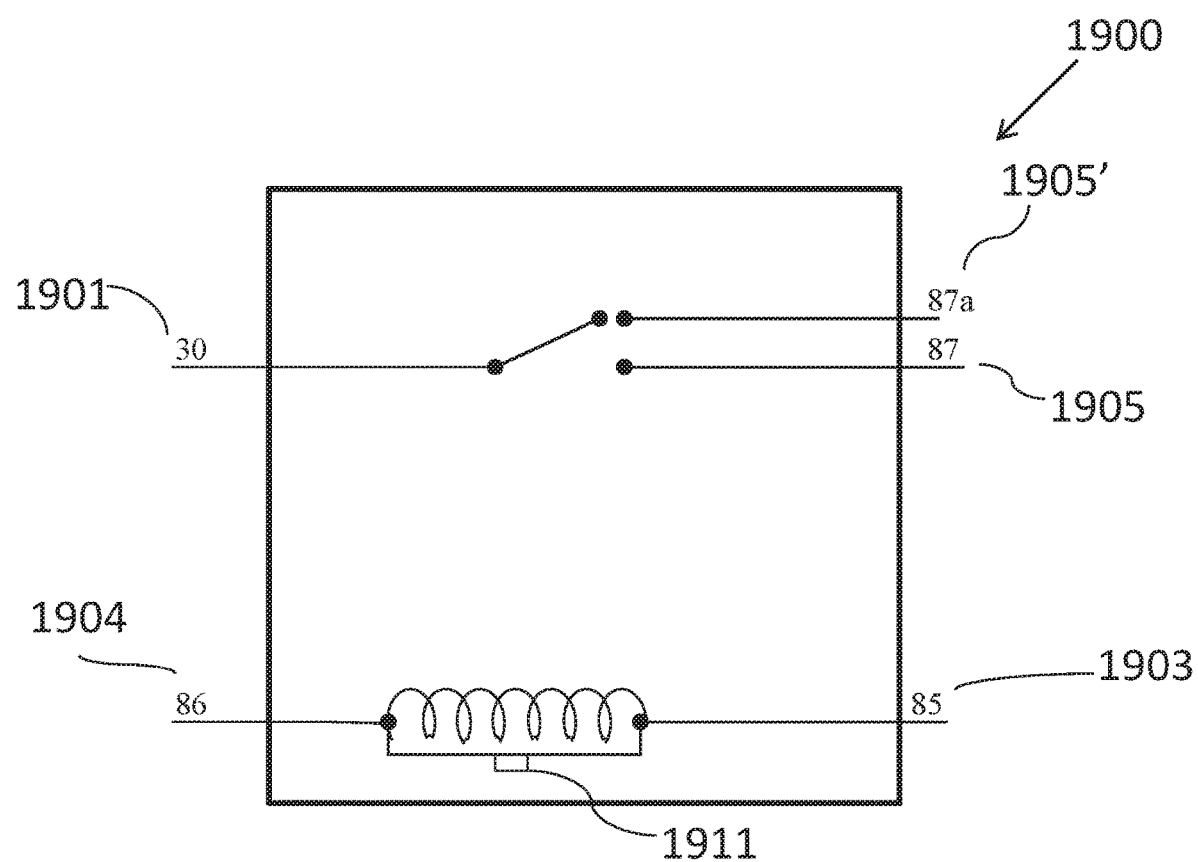
FIG. 8 illustrates an embodiment of a self-diagnosing relay circuitry of the subject invention.

FIG. 8 illustrates an embodiment of a self-diagnosing relay circuitry of the subject invention, shown generally at 1900. Relay 1900 includes terminals 30, 85, 86, 87 and 87a shown at 1901, 1903, 1904, 1905 and 1905', respectively. Green LED 1911 terminals 86/85 signals when relay 1900 is energized and the switch switches from 87a (NC) to 87 (NO).

Figure 9:
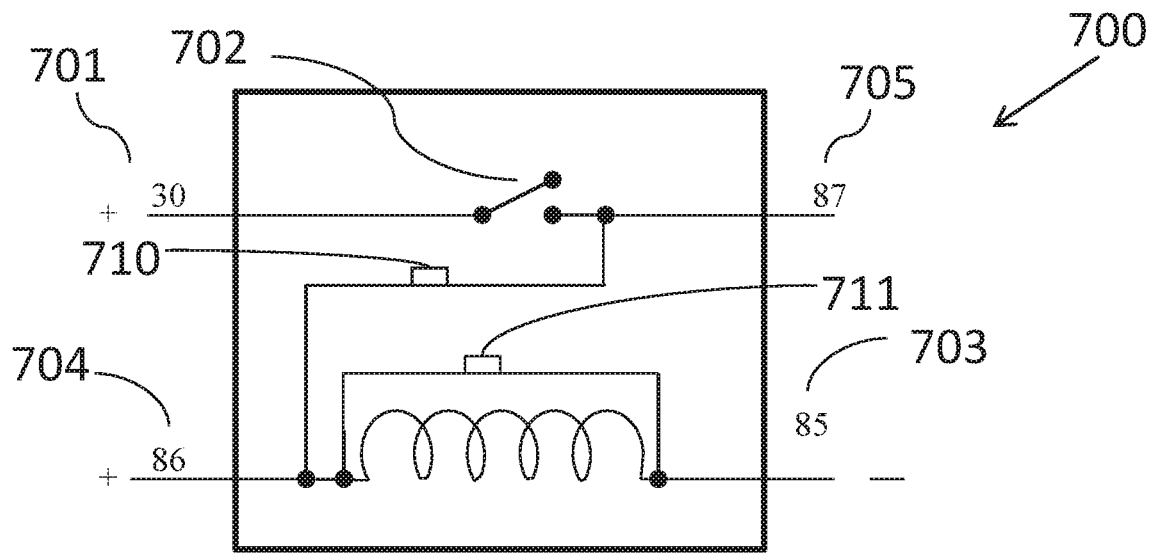
FIG. 9 illustrates a relay circuitry of the subject invention showing a 4 pin relay.

FIG. 9 illustrates a relay circuitry of the subject invention showing a 4 pin relay, shown generally at 700. Relay 700 is a 4 pin relay appointed to control one or more electrical circuits by opening and closing contacts in another circuit. When relay 700 contact is normally open (NO) at circuitry for terminal 30 shown at 701 there is an open contact 702 when the relay 700 not energized. Circuitry for terminals 85, 86 and 87 are shown at 703, 704, and 705, respectively. A trouble diagnostic LED 710, preferably being a red LED, is in electrical line with terminal 86 and terminal 87. When the red LED is on or emitting light, it indicates that the relay contacts are damaged. A control LED, preferably being a green LED, is shown at 711 in-line with terminal 86 and terminal 85 indicating that relay is activated or energized. Normally, power is pulled from terminal 86 to 87 to check voltage between terminal 30 and terminal 87. However, some upstream circuits (for example in a vehicle) are controlled in a manner wherein terminal 86 is always positive in order to energize the relay; other upstream circuits are energized when the key is on, feeding power to terminal 86, or through the vehicle main power board. Sometimes red LED 710 is on even though the relay is not failing, depending on how the circuitry is wired. Generally however, when the green LED is energized and the red light off, the relay is operating normally. When there is a failure, both the green LED 711 and red LED 710 are on.

Figure 10:
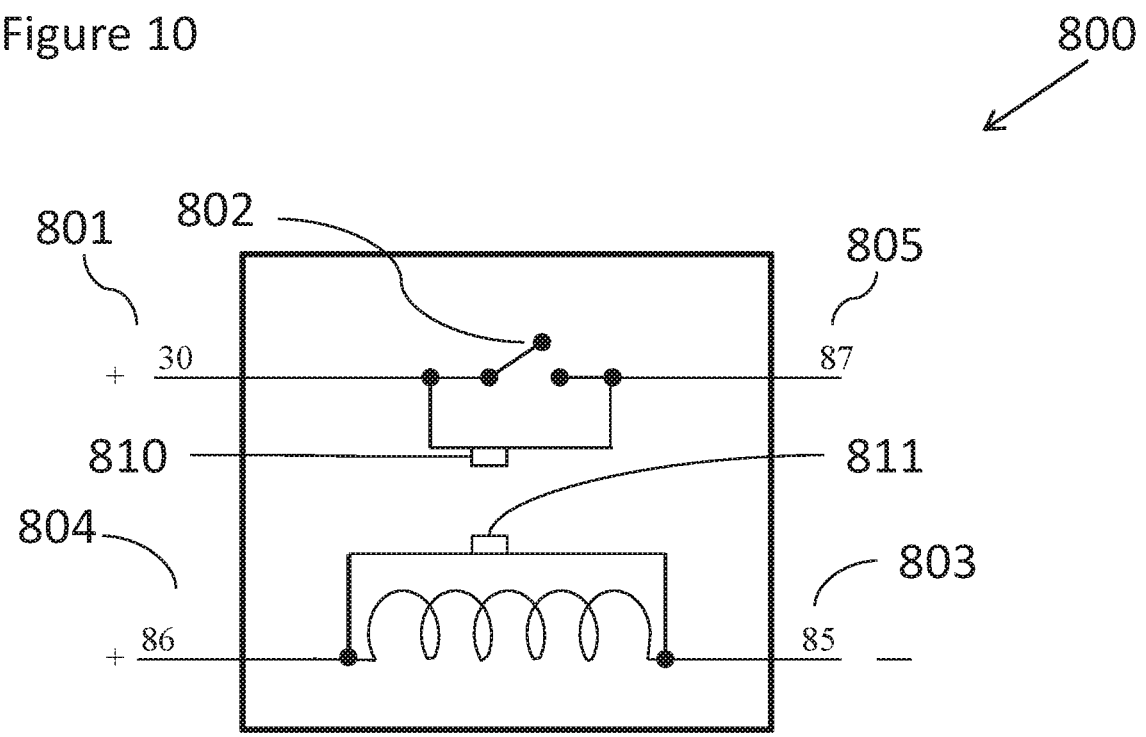
FIG. 10 illustrates another relay circuitry of the subject invention showing a 4 pin relay.

FIG. 10 illustrates another relay circuitry of the subject invention showing a 4 pin relay N.O., shown generally at 800. Relay 800 is a 4 pin relay appointed to control one or more electrical circuits by opening and closing contacts in another circuit. When relay 800 contact is normally open (NO) at circuitry for terminal 30 shown at 801, there is an open contact 802 if the relay 800 not energized. Circuitry for terminals 85, 86 and 87 are shown at 803, 804, and 805, respectively. A trouble diagnostic LED 810, preferably being a red LED, is shown in electrical line with terminal 30 and terminal 87. When the red LED is on or emitting light, it indicates that the contacts are damaged. A second LED, or control LED, preferably being a green LED, is shown at 811 in-line with terminal 86 and terminal 85. When illuminated, the green LED indicates that the relay is energized or activated. This relay circuitry operates similarly to that shown in FIG. 9 except that the red LED 810 is located in electric circuitry with terminals 30 and 87 rather than terminals 86 and 87.

Figure 11:
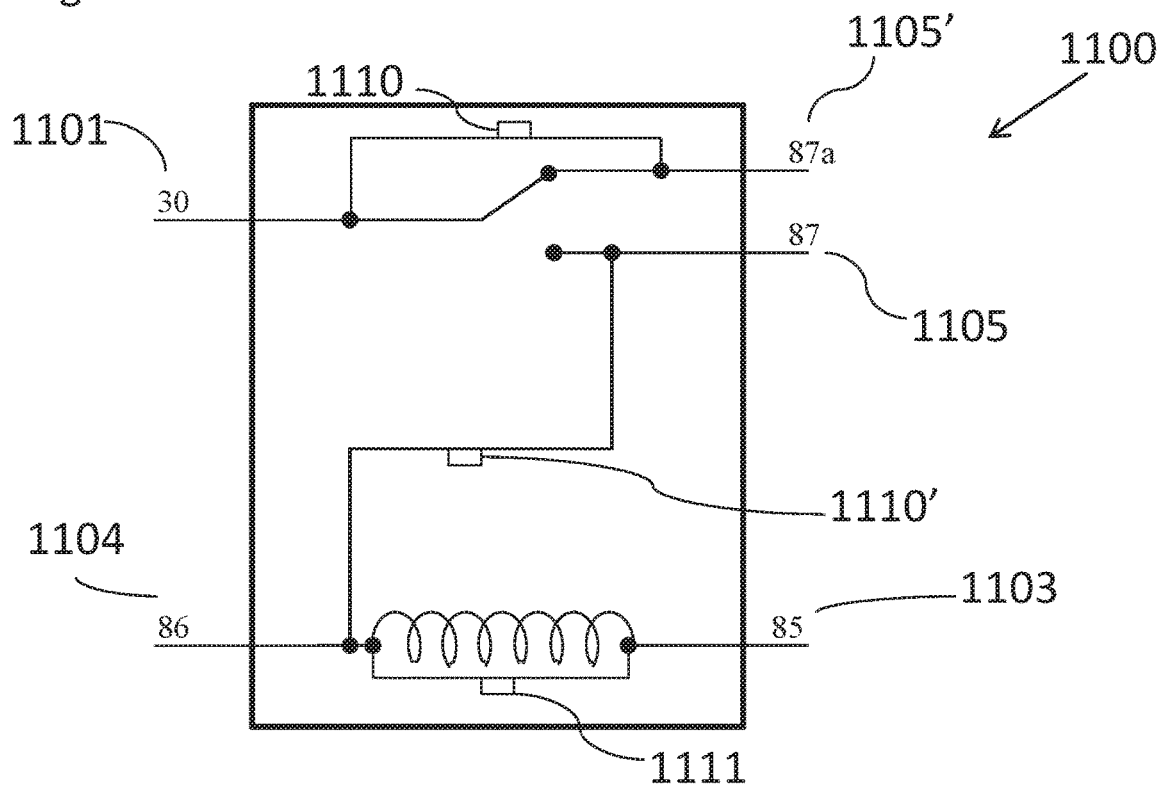
FIG. 11 illustrates another relay circuitry of the subject invention showing a 5 PIN relay, 87a and 87.

FIG. 11 illustrates another relay circuitry of the subject invention showing a 5 PIN relay, 87a normally closed (N.C.) and 87 N.O, shown generally at 1100. Relay 1100 is a 5 pin relay with terminal 87a normally closed (N.C.) and 87 N.O. shown at 1105', 1105, respectively. Circuitry for terminals 30, 85 and 86 is shown at 1101, 1103 and 1104, respectively. A first trouble diagnostic LED 1110, preferably being a red LED, is in electrical line with terminal 30 and terminal 87a. A second trouble diagnostic LED 1110', preferably being a red LED, is in electrical line with terminal 86 and 87. When either or both of the red LEDs are on or emitting light, this condition indicates that the relay is damaged. A control LED, preferably being a green LED, is shown at 1111 in-line with terminal 86 and terminal 85 for indicating that the relay is activated or energized.

Figure 12:
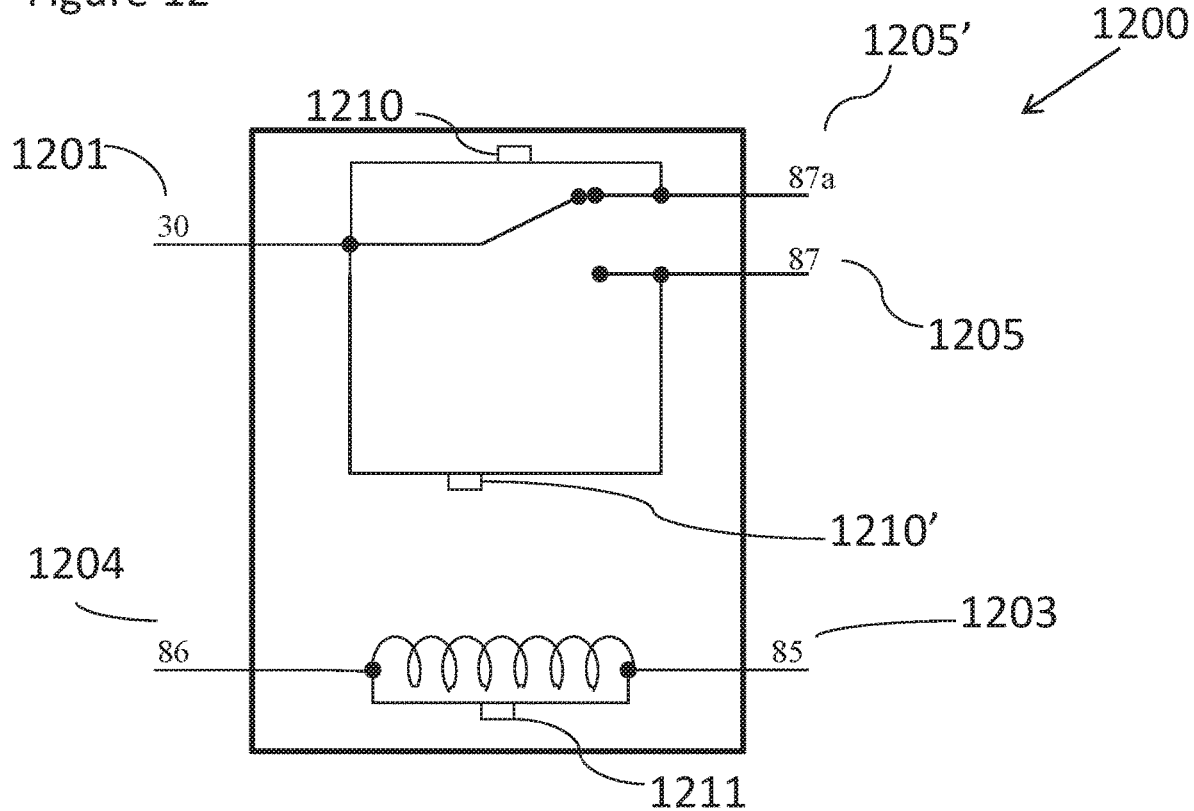
FIG. 12 illustrates another relay circuitry of the subject invention showing a 5 PIN relay, 87a and 87.

FIG. 12 illustrates another relay circuitry of the subject invention showing a 5 PIN relay, 87a N.C. and 87 N.O, shown generally at 1200. Relay 1200 is a 5 pin relay with terminal 87a normally closed (N.C.) and 87 N.O. shown at 1205', 1205, respectively. Circuitry for terminals 30, 85 and 86 is shown at 1201, 1203 and 1204, respectively. A first trouble diagnostic LED 1210, preferably being a red LED, is in electrical line with terminal 30 and terminal 87a. A second trouble diagnostic LED 1210', preferably being a red LED, is in electrical line with terminal 86 and 87. When either or both of the red LEDs are on or emitting light, this condition indicates that the relay is damaged. A control LED, preferably being a green LED, is shown at 1211 in-line with terminal 86 and terminal 85 for indicating that the relay is activated or energized.

Figure 13:
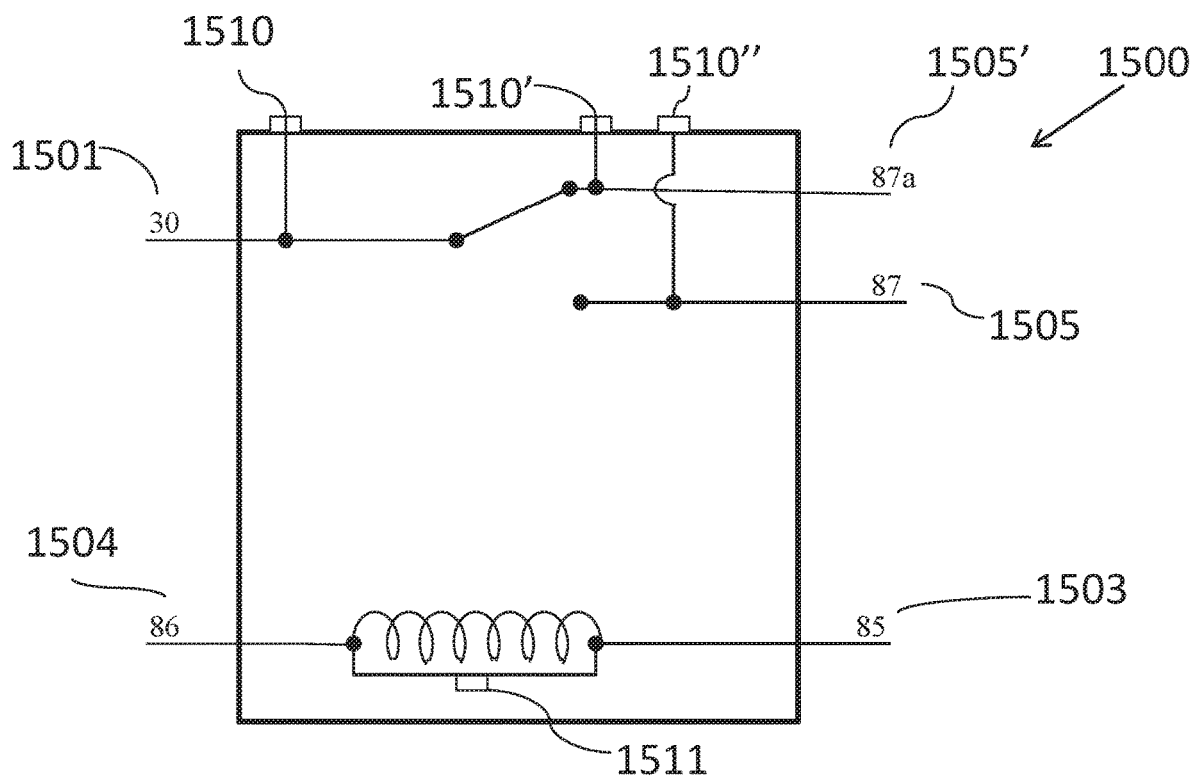
FIG. 13 illustrates another relay circuitry of the subject invention showing a hybrid self-diagnosing/testable relay.

FIG. 13 illustrates another relay circuitry of the subject invention showing a 5 PIN relay, 87a N.C. and 87 N.O., shown generally at 1500. The relay is a combination or hybrid, including the LED showing when activated but also including with testable contact terminals 1510, 1510' and 1510" for testing. Relay 1500 is a 5 pin relay with terminal 87a normally closed (N.C.) and 87 N.O. shown at 1505', 1505, respectively. Circuitry for terminals 30, 85 and 86 is shown at 1501, 1503 and 1504, respectively. Testable probe or testable contacts 1510, 1510' and 1510", are tested by way of a multimeter. A control LED, preferably being a green LED, is shown at 1511 in-line with terminal 86 and terminal 85 indicating that the relay is activated or energized.

Figure 14:
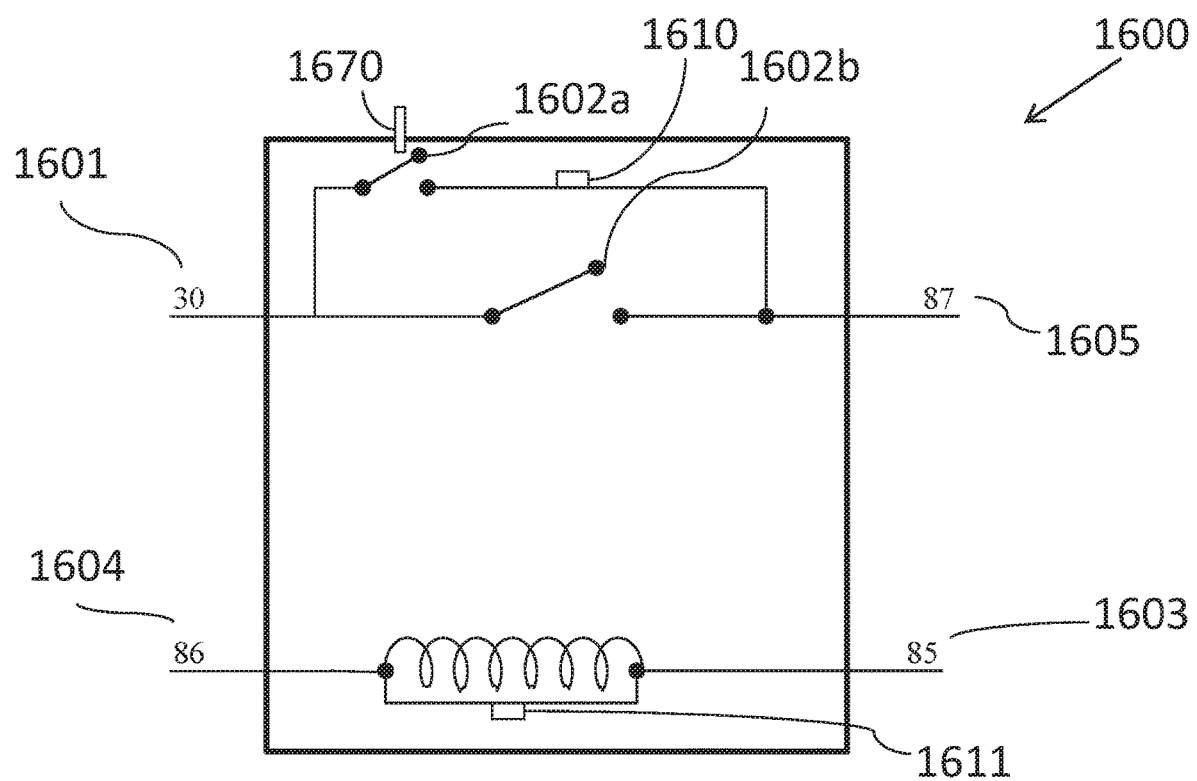
FIG. 14 illustrates another relay circuitry of the subject invention showing a 4 pin manual test push-button relay.

FIG. 14 illustrates another relay circuitry of the subject invention showing a 4 pin manual test push-button relay, shown generally at 1600. Relay 1600 is normally open (NO) at circuitry terminal 30 shown at 1601 with open contacts 1602a, 1602b when the relay 1600 not energized. A push-button 1670 closes NO open contact 1602a. Circuitry for terminals 85, 86 and 87 are shown at 1603, 1604, and 1605, respectively. A trouble diagnostic LED 1610, preferably being a red LED, is in electrical line with terminals 30/push-button 1670/terminal 87. When the push-button 1670 is pressed to close contact 1602a, when green LED is lit, and if the diagnostic/red LED 1610 emits light, this condition indicates that the relay is damaged. A second LED, or control LED, preferably being a green LED, is shown at 1611 in-line with terminal 86 and terminal 85 for indicating that the relay is energized.

Figure 15:
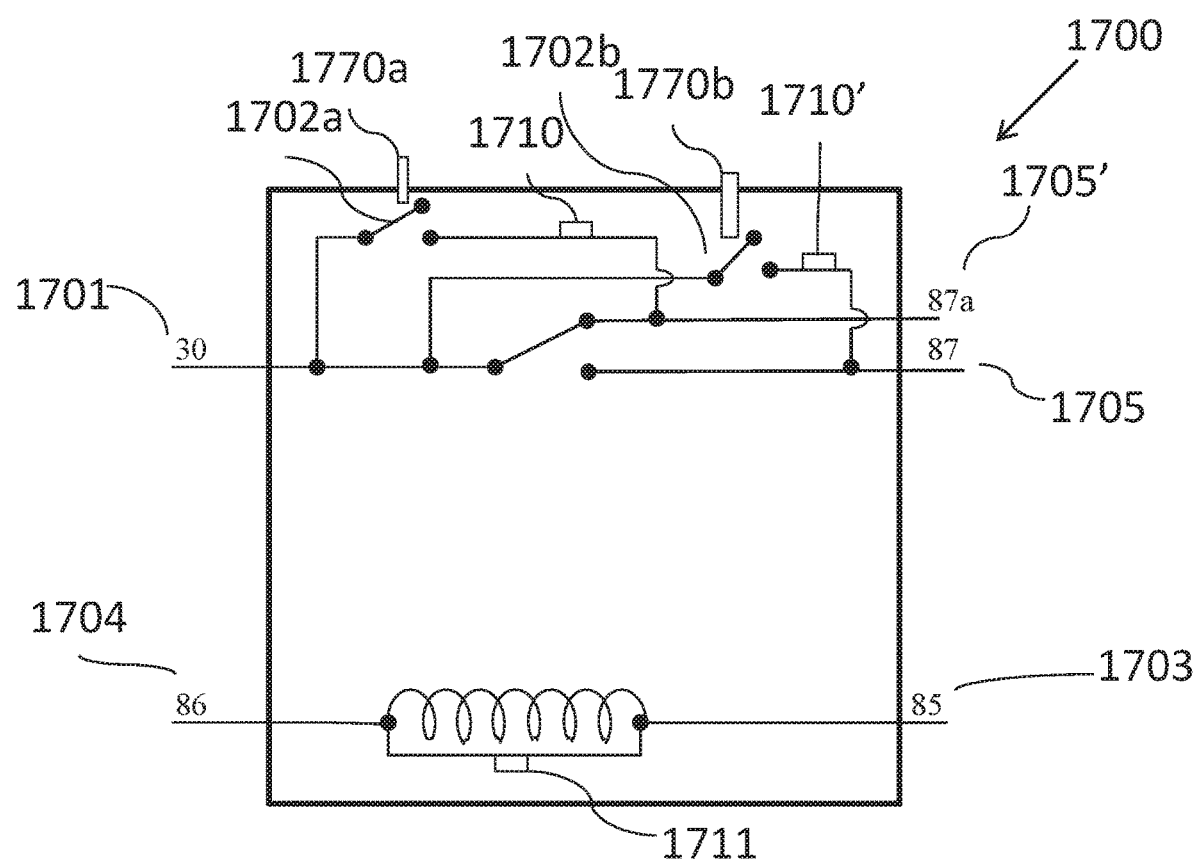
FIG. 15 illustrates another relay circuitry of the subject invention showing a 5 pin manual test push-button relay.

FIG. 15 illustrates another relay circuitry of the subject invention showing a 5 pin manual test push-button relay, shown generally at 1700. Relay 1700 is a 5 pin relay with terminals 30, 85, 86, 87 and 87a shown at 1701, 1703, 1704, 1705 and 1705', respectively. A push-button 1770a closes NO contact 1702a to test terminal 87a at 1705'. A first trouble diagnostic LED 1710, preferably being a red LED, is in electrical line with terminals 30/push-button 1770a and 87a. If the LED does light up, there is a bad contact. A second push-button 1770b closes NO contact 1702b to test terminal 87 at 1705 and is in line with a second trouble diagnostic LED 1710', again preferably, but not necessarily red. If the LED does light up, there is a bad contact on the 87 circuit. Green LED 1711 is in-line with terminals 86/85 signals when relay 1700 is energized.

Figure 16A:
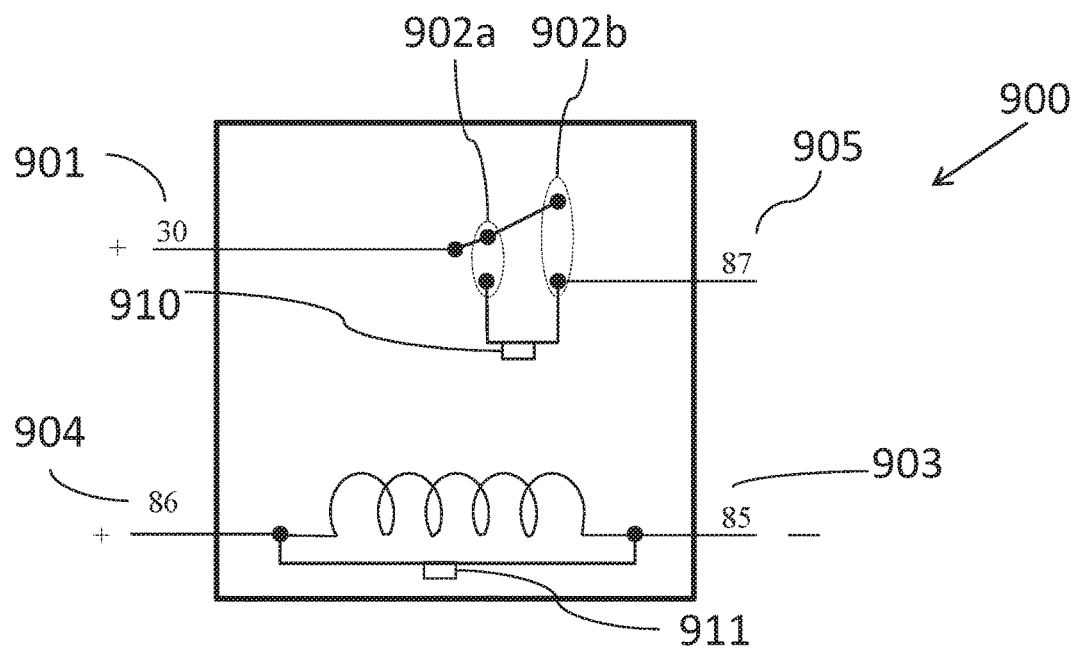
FIG. 16a illustrates another relay circuitry of the subject invention showing a dual contact 4 pin relay.
Figure 16B:
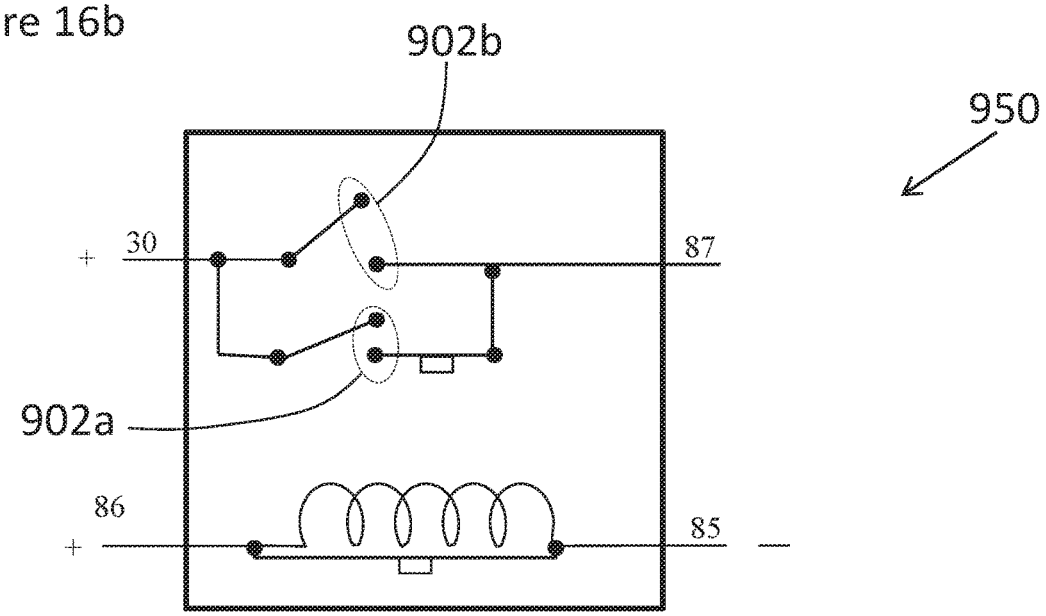

FIG. 16a illustrates another relay circuitry of the subject invention showing a 4 pin relay. FIG. 16b illustrates an alternative relay circuitry of FIG. 16a, shown generally at 950. Referring to FIGS. 16a and 16b, another relay circuitry of the subject invention showing a 4 pin relay N.O., shown generally at 900. Relay 900 is a 4 pin relay appointed to control one or more electrical circuits by opening and closing contacts in another circuit. Relay 900 contact is normally open (NO) at circuitry terminal 30 shown at 901 with LED contacts 902a and load contacts 902b when the relay 900 not energized. Circuitry for terminals 85, 86 and 87 are shown at 903, 904, and 905, respectively. A trouble diagnostic LED 910, preferably being a red LED, is in electrical line with terminal 30 and terminal 87. When the red LED is on or emitting light, it indicates that the relay contacts are damaged. A second LED, or control LED, preferably being a green LED, is shown at 911 in-line with terminal 86 and terminal 85 to indicate when the relay is energized or activated. Green LED 911 is in-line with terminals 86/85 signals when relay 900 is energized and power is fed from terminals 30-87. A separate set of contacts pulls power from the 30 terminal 901. If voltage drops between terminals 30-87 at load bearing contact the red LED 910 emits light.

Figure 17A:
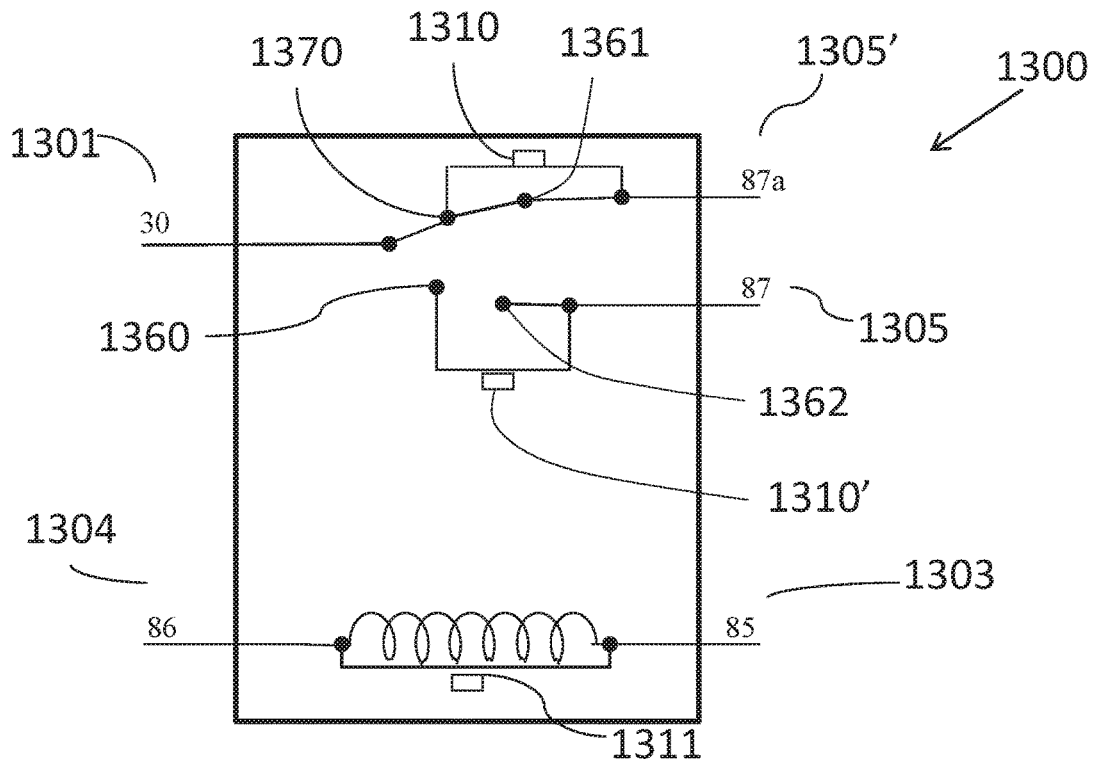
FIG. 17a illustrates another relay circuitry of the subject invention showing a dual contact 5 PIN relay, 87a and 87.
Figure 17B:
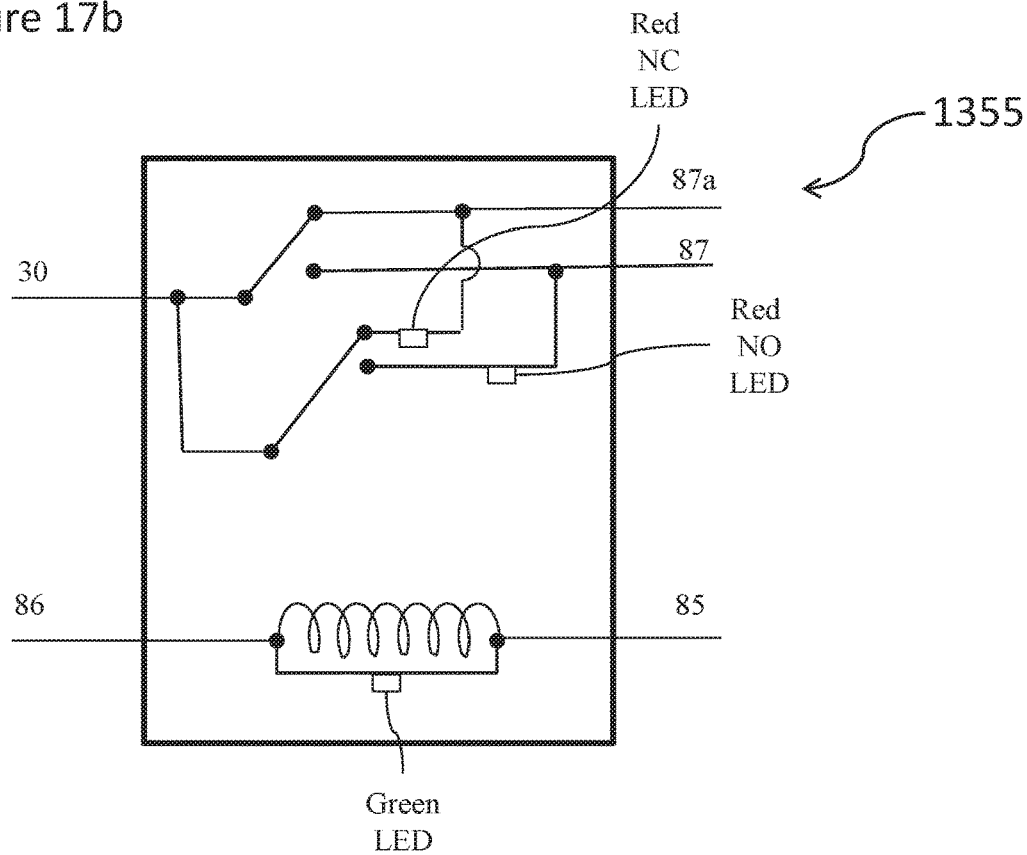

FIG. 17a illustrates another relay circuitry of the subject invention showing a 5 PIN relay, 87a and 87. FIG. 17b illustrates an alternative relay circuitry of FIG. 17a. Referring to FIGS. 17a and 17b, another relay circuitry of the subject invention showing a 5 PIN relay, 87a N.C. and 87 N.O is shown generally at 1300. Relay 1300 is a 5 pin relay with terminal 87a normally closed (N.C.) and 87 N.O. shown at 1305', 1305, respectively. Circuitry for terminals 30, 85 and 86 is shown at 1301, 1303 and 1304, respectively. 87a LED contact is shown at 1370. A first trouble diagnostic 87a LED 1310, preferably being a red LED, is in electrical line with terminal 30 and terminal 87a. 87a load contact is shown at 1361. A second trouble diagnostic 87 LED 1310', preferably being a red LED, is in electrical line with LED contact 1360 and terminal 87. When either of the red LEDs are on or emitting light, this condition indicates that the relay is damaged. A control LED, preferably being a green LED, is shown at 1311 in-line with terminal 86 and terminal 85 for indicating that the relay is activated or energized. Alternative relay circuitry is shown at 1355 in FIG. 17b.

Figure 18A:
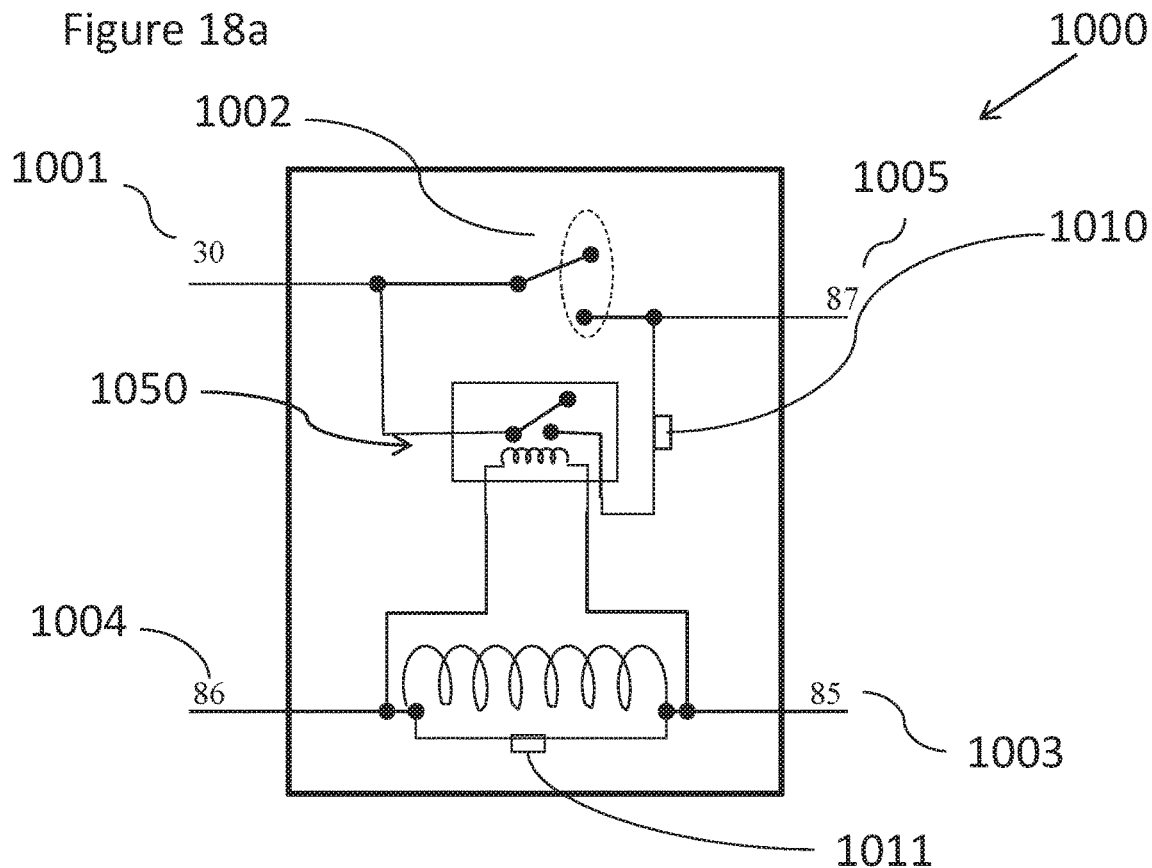
FIG. 18a illustrates another relay circuitry of the subject invention showing a 4 pin relay with a small internal relay to control red LED.

FIG. 18a illustrates another relay circuitry of the subject invention showing a 4 pin relay with a small internal relay for red LED control, shown generally at 1000. Relay 1000 contact uses a separate internal electromagnetic small relay and 4 pins or terminals 30, 85, 86 and 87 shown at 1001, 1003, 1004 and 1005, respectively. Relay 1000 contact is normally open (NO) in-line with circuitry terminal 30/87 with open contact 1002 when the relay 1000 is not energized. The small internal relay 1050 is for the red LED control. It switches on or off when a small external voltage is applied across its control terminals 85/86. Additionally, when the relay is not energized, the small relay is also open between terminal 30/red LED/87. When relay 1000 is energized, it closes contacts 2002, closing the circuit between terminals 30 and 87. Also, when the relay is energized, the contacts in the small relay close, closing the circuit between terminal 30/red LED/terminal 87. If there is a bad connection at contacts 1002 and there is a difference in voltage between terminals 30 and 87, voltage will push through the LED circuit, illuminating the LED.

Figure 18B:
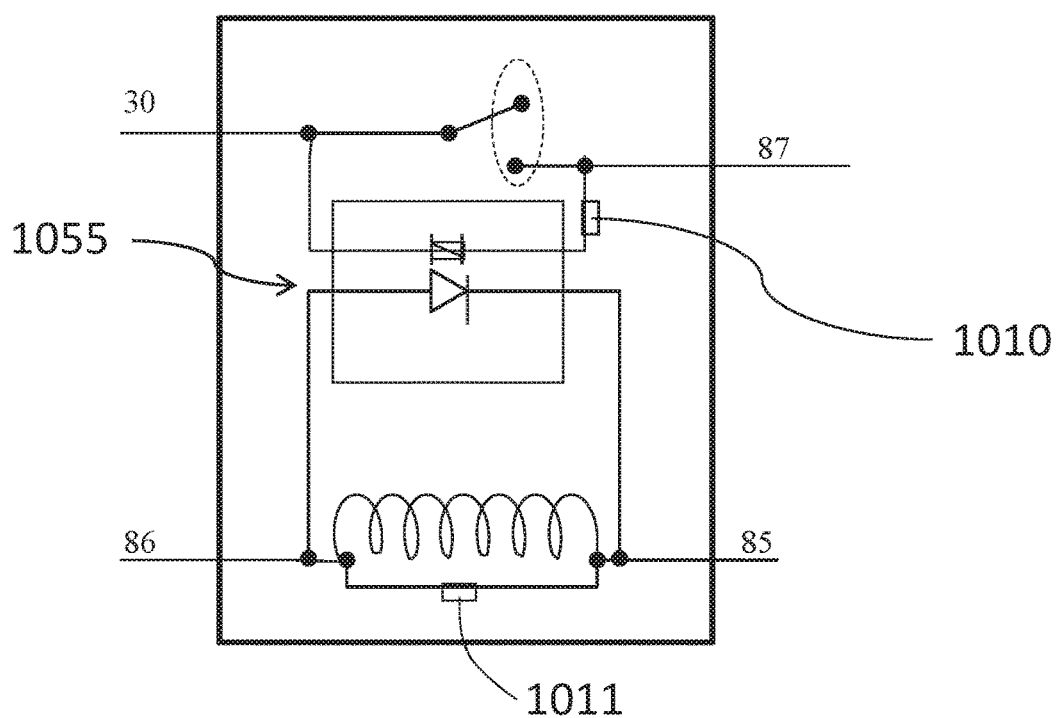
FIG. 18b illustrates an alternative relay circuitry of FIG. 18a with a solid state relay to control red LED.

FIG. 18b illustrates an alternative relay circuitry of FIG. 18a. The functionality of FIG. 18b is identical to that of 18a but with a solid state relay in replacement of the small internal relay for red diagnostic LED control.

Figure 19:
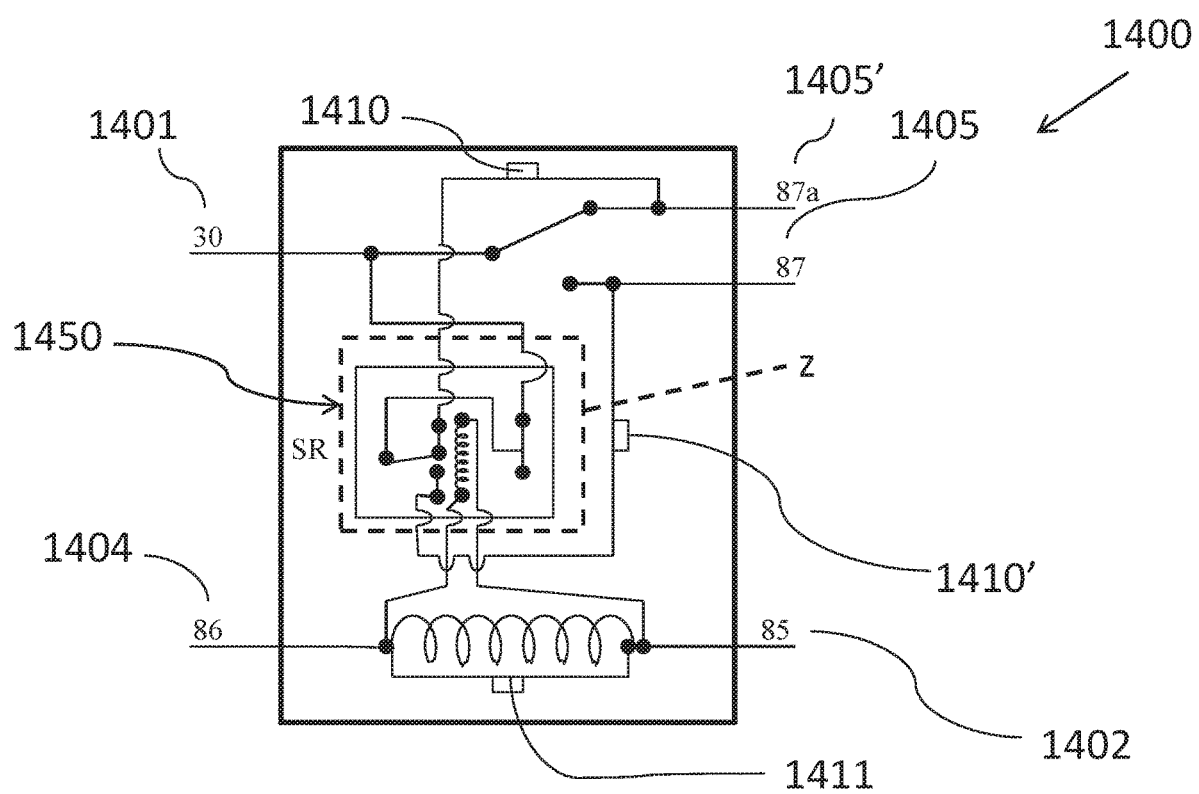
FIG. 19 illustrates another relay circuitry of the subject invention showing a 5 pin relay using a small relay for red LED actuation.

FIG. 19 illustrates another relay circuitry of the subject invention showing a 5 PIN small relay, 87a N.C. and 87 N.O, shown generally at 1400. Relay 1400 is a relay with 5 pins or terminals 30, 85, 86, 87 and 87a shown at 1401, 1403, 1404, 1405 and 1405', respectively. A small internal relay 1450 switches on or off when a small external voltage is applied across its control terminals. This small internal relay controls the power to the diagnostic LEDs. The first trouble diagnostic LED 1410, preferably being a red LED, is in electrical line with terminal 30 small relay/87a. A second trouble diagnostic LED 1410' is in electrical line with 30/small relay/87. When one of the red LEDs are on or emitting light, this condition indicates that the relay is damaged. A control LED, preferably being a green LED, is shown at 1411 in-line with terminal 86, 85 for indicating that the relay is activated or energized.

Figure 20:
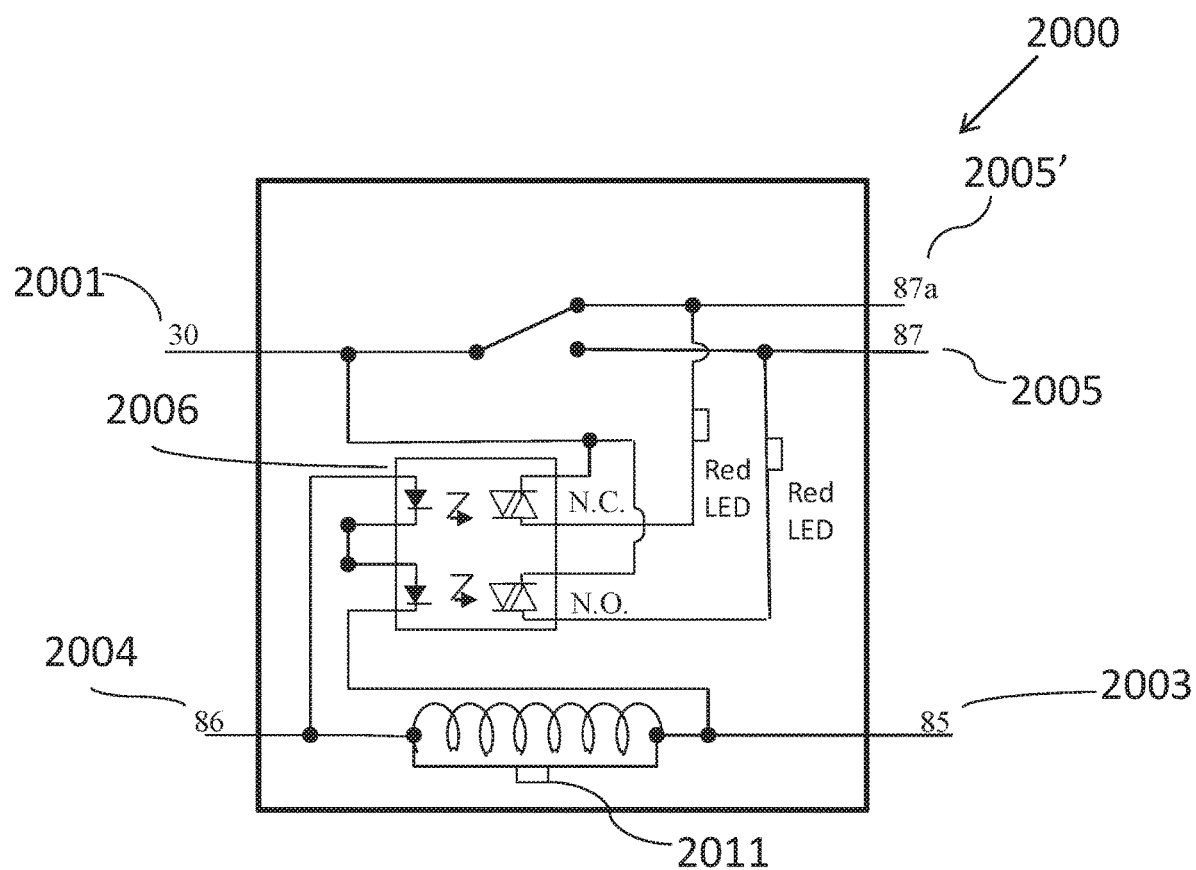
FIG. 20 illustrates an embodiment of a 5 pin relay that uses a Solid State Relay for red LEDs.

FIG. 20 illustrates an embodiment of a 5 Pin self-diagnosing utilizing a Solid State Relay (SSR), for red LED control, shown generally at 2000. Relay 2000 includes terminals 30, 85, 86, 87 and 87a shown at 2001, 2003, 2004, 2005 and 2005', respectively. Green LED 2011 is in-line with terminals 86/85 and signals when relay 2000 is energized and power is fed from terminals 30-87. An SSR 2006 controls the power to the diagnostic LED.

Figure 21:
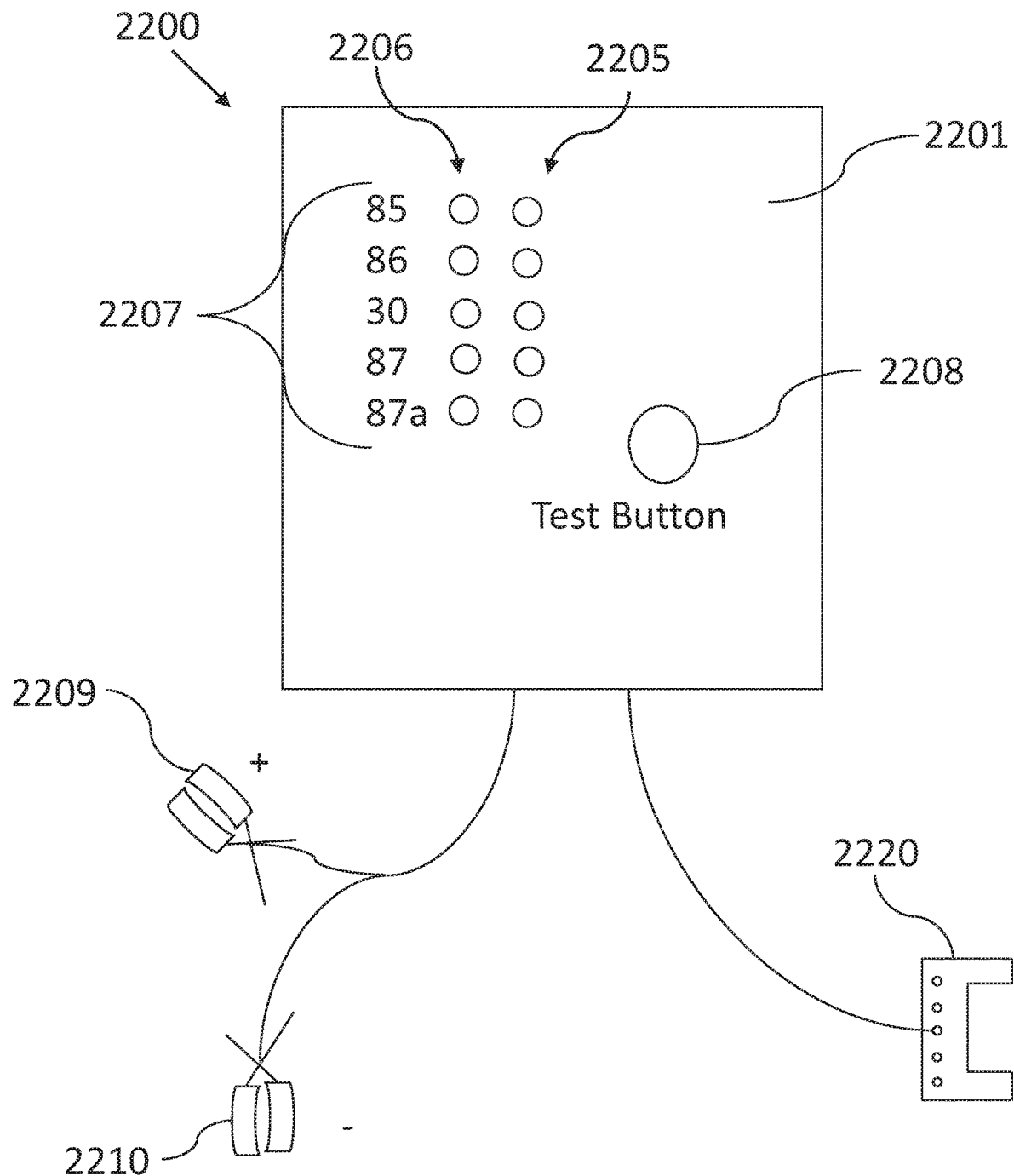
FIG. 21 illustrates an embodiment of a testable relay tool.
Figure 22:
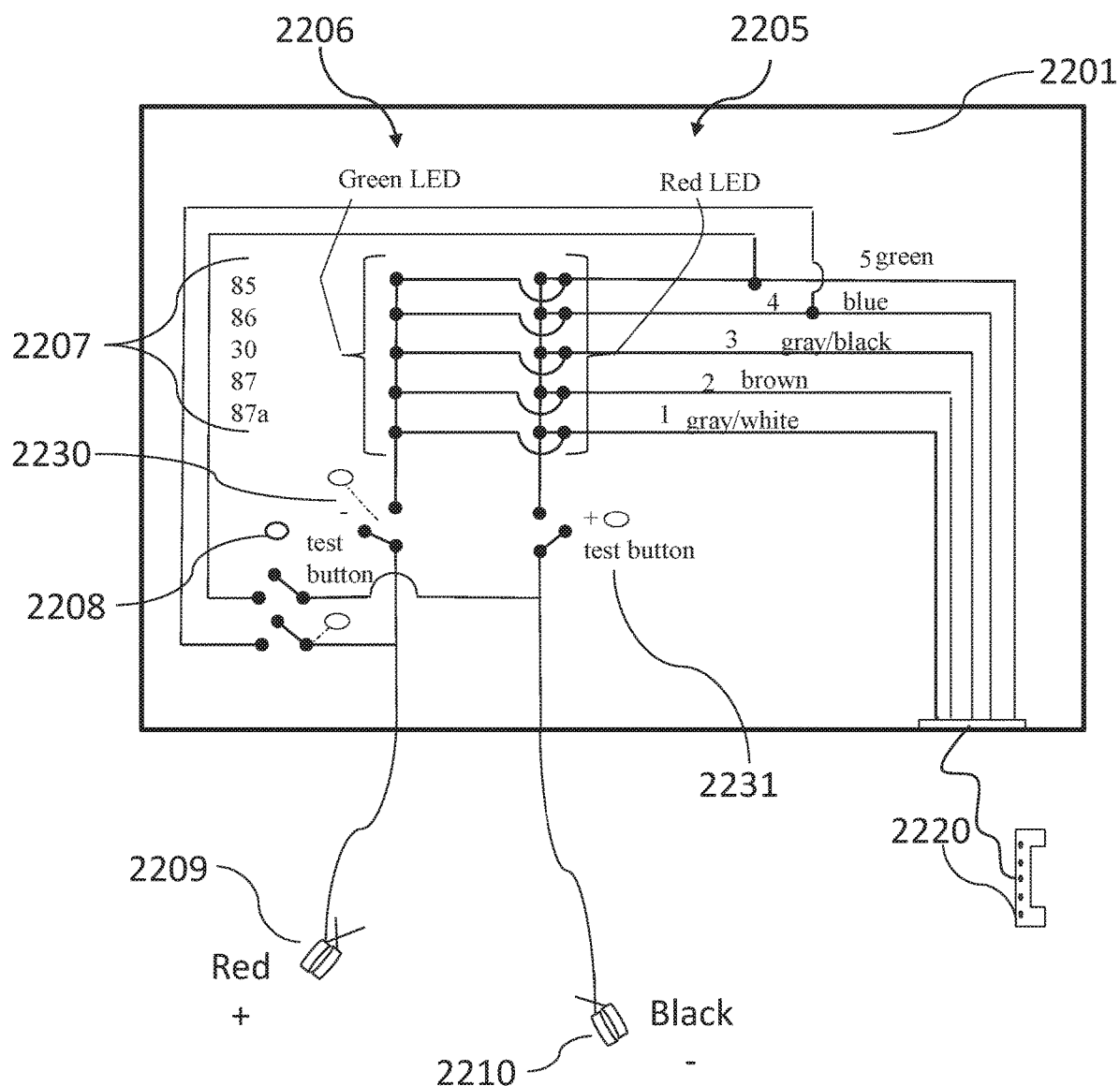
FIG. 22 illustrates an embodiment of circuitry for the testable relay tool of FIG. 21.

FIG. 21 illustrates an embodiment of a testable relay tool, shown generally at 2200. FIG. 22 illustrates an embodiment of circuitry for the testable relay tool of FIG. 21. Referring to FIGS. 21-22, testable relay tool 2200 is constructed having a top wall 2201 including a series of apertures making visible a row of red LED (+) and green LED (−) indicator lights, 2205 and 2206, respectively, viewable from the top wall 2201 of the testable relay tool 2200. Alternatively, the top wall 2201 of the relay tool 2200 may be composed of a transparent/clear material so that the lights are under the transparent material and are visible through the top wall 2201. Each row of red LED and green LEDs, 2205 and 2206, corresponds or aligns with relay terminals 85, 86, 30, 87 and 87a as shown generally at 2207. A test button 2208 is provided feeding—to terminal 85 and power to terminal 86. + and − terminals are provided attached along wires with alligator clips (red +) (green −) for connection to a battery/power source, shown at 2209 and 2210. A plug 2220 is wired to testable relay tool 2200. Circuitry for the testable relay tool of FIG. 22 is shown in FIG. 23. Contact 2230 is in-line with (−) test button for green LEDs 2206. Contact 2231 is in-line with (+) test button for red LEDs 2205.

Figure 23A:
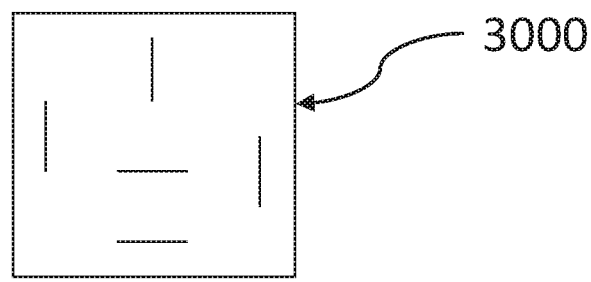
FIG. 23a is a top view of an embodiment of a relay insert.
Figure 23B:
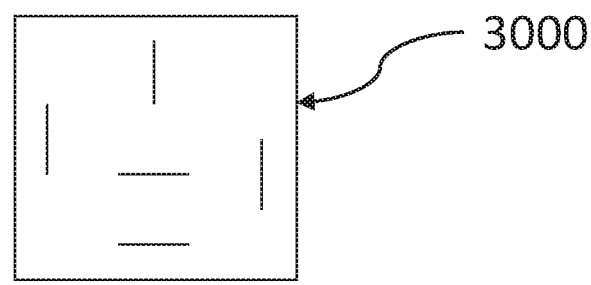
FIG. 23b is a bottom view of an embodiment of a relay insert.
Figure 23C:
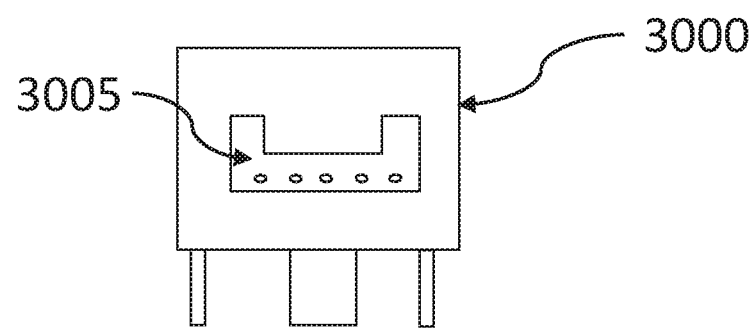
FIG. 23c is a side view of an embodiment of a testable relay insert also shown in FIGS. 23a and 23b, illustrating a side plug for use with the testable relay tool of FIG. 21.

FIGS. 23a-23c illustrate views of a testable relay insert that can be used in conjunction with nontestable relays and the testable relay tool. FIG. 23a is a top view of an embodiment of any representative relay insert 3000 having plugs for receiving a non-testable relay inserted therein. FIG. 23b is a bottom view of the relay 3000 that would plug into the circuit with terminals. FIG. 23c is a side view the relay 3000 with a testable relay plug 3005 for the relay tool. Advantageously, insert 3000 plugs in underneath any relay between the relay and circuit to make it testable with the testable relay tool. Alternatively, 3005 could be a set of controls and diagnosing LED instead of a plug for the tool.

Figure 24A:
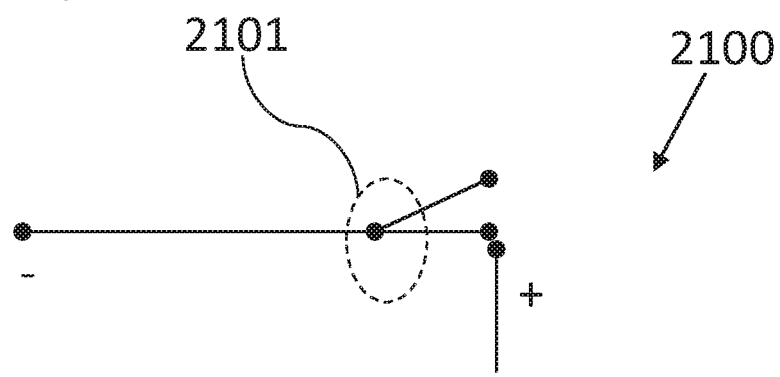
FIG. 24a illustrates an embodiment of a non reset-able breaker, an alternative to a red LED.

FIG. 24a illustrates an embodiment of a non-reset-able breaker, shown generally at 2100. Nonresetable breaker 2100 takes the place of/or acts as a red LED substitute. If contacts fail, breaker 2100 presents a red dot 2101 against a clear/transparent cover of the relay that is visible from the outside or exterior so that the red dot/contact fail is seen by a user.

Figure 24B:
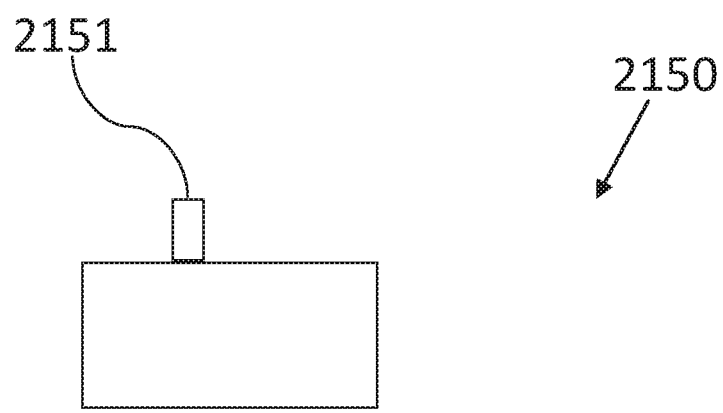
FIG. 24b illustrates an embodiment of a reset-able breaker, an alternative to a red LED.

FIG. 24b illustrates an embodiment of a reset-able breaker, shown generally at 2150. If the contacts fail, breaker 2150 pushes up a fail button 2151/indicator that can be reset by a user, taking place of red LED.

Figure 24C:
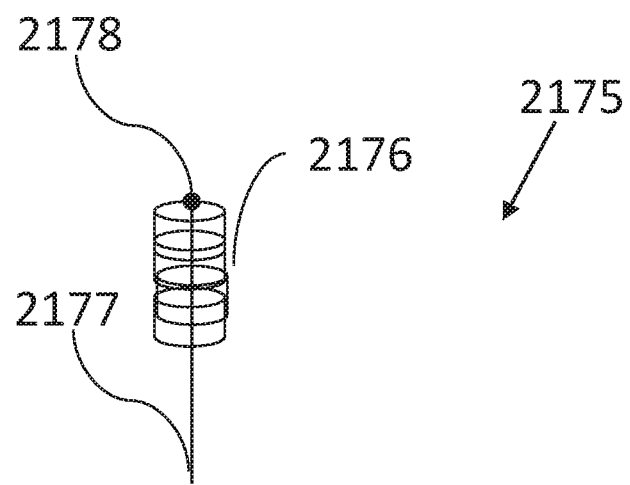
FIG. 24c illustrates an embodiment of a spring pop-up breaker, an alternative to a red LED.

FIG. 24c illustrates an embodiment of a spring pop-up breaker, shown generally at 2175. Spring pop up 2175 is constructed having a compress spring 2176 that is held down by a small wire 2177 fused together so that if enough amps pass through it, the fuse releases the spring 2175 to press a red dot 2178 against a clear cover of a relay so that the red dot is visible to the user (via 21*a*), taking place of red LED.

Having thus described the invention in rather full detail, it will be understood that such detail need not be strictly adhered to, but that additional changes and modifications may suggest themselves to one skilled in the art, all falling within the scope of the invention as defined by the subjoined claims.

What is claimed is:

1. A self-diagnosing, testable sealed relay comprising:
   a. a relay housing having a bottom wall with pins/terminals adapted to connect a circuit, side walls, and an opposing top wall forming a cavity with electrical components including an electromagnetic coil for carrying a current;
   b. a contact circuitry electrically connected to said components and at least two light-emitting diodes (L.E.D.s), wherein one of said L.E.D. indicates a primary signal that said relay is energized, and another L.E.D. light is a diagnostic L.E.D. and indicates if said relay is damaged;
   c. said top wall having apertures corresponding to each L.E.D. so that each L.E.D. is visible and adapted to be seen by a user;
   d. direct, testable terminals located in said top wall directly corresponding to and in electrical communication with said bottom wall terminals;
   e. said testable terminals being formed as flat prongs flush on a horizontal plane with said top wall, so that said testable terminals are not protruded or indented, and being exposed to facilitate testing said relay by applying a multimeter device to test voltage.

2. The self-diagnosing, testable sealed relay of claim 1, wherein said electrical components comprise an electromagnetic device.

3. The self-diagnosing, testable sealed relay of claim 1, wherein said electrical components comprise a solid state relay device.

4. The self-diagnosing, testable sealed relay of claim 1, wherein said relay housing is transparent.

5. The self-diagnosing, testable sealed relay of claim 1, wherein said relay is a 5 pin or terminal relay.

6. The self-diagnosing, testable sealed relay of claim 1, wherein said relay is a 4 pin or terminal relay.

7. The self-diagnosing, testable sealed relay of claim 1, wherein there are two diagnostic L.E.D.s for diagnosing terminal connections.

8. The self-diagnosing, testable sealed relay of claim 1 comprising a push-button contact for testing circuit connectivity of one or more of said terminals.

9. The self-diagnosing, testable sealed relay of claim 1 comprising single contact circuitry in electrical connection to said components and said L.E.D.s, wherein one of said L.E.D. lights indicates that the electromagnetic coil is energized indicating a normally open (NO) contact, and another L.E.D. light indicates if NO and/or normally closed (N.C.) contacts are bad when the primary circuit is activated.

10. The self-diagnosing, testable sealed relay of claim 1 comprising a dual contact circuitry electrically connected to said components and said L.E.D.s, wherein one L.E.D. light indicates that the electromagnetic coil is energized validating a normally open (NO) contact, and another L.E.D. light includes an extra contact that pulls power from a primary terminal and illuminates if the NO and/or normally closed (N.C.) contacts are bad when the primary circuit is activated.

\* \* \* \* \*